(12) United States Patent
Jeng et al.

(10) Patent No.: US 12,113,025 B2
(45) Date of Patent: Oct. 8, 2024

(54) SEMICONDUCTOR PACKAGE WITH DUAL SIDES OF METAL ROUTING

(71) Applicant: Taiwan Semiconductor Manufacturing Co., Ltd., Hsinchu (TW)

(72) Inventors: Shin-Puu Jeng, Hsinchu (TW);
Shuo-Mao Chen, New Taipei (TW);
Hsien-Wen Liu, Hsinchu (TW);
Po-Yao Chuang, Hsinchu (TW);
Feng-Cheng Hsu, New Taipei (TW);
Po-Yao Lin, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 16 days.

(21) Appl. No.: 17/881,981

(22) Filed: Aug. 5, 2022

(65) Prior Publication Data
US 2022/0375843 A1     Nov. 24, 2022

Related U.S. Application Data

(60) Continuation of application No. 16/569,850, filed on Sep. 13, 2019, now Pat. No. 11,456,257, which is a
(Continued)

(51) Int. Cl.
*H01L 23/538*     (2006.01)
*H01L 21/768*     (2006.01)
(Continued)

(52) U.S. Cl.
CPC .... *H01L 23/5385* (2013.01); *H01L 21/76885* (2013.01); *H01L 23/3128* (2013.01);
(Continued)

(58) Field of Classification Search
CPC ... H01L 2224/0603; H01L 2224/06051; H01L 2224/06102; H01L 2224/06505;
(Continued)

(56) References Cited

U.S. PATENT DOCUMENTS 8,361,842 B2    1/2013    Yu et al.
8,680,647 B2    3/2014    Yu et al.
(Continued)

FOREIGN PATENT DOCUMENTS

CN     101120445 A     2/2008
CN     104253105 A     12/2014
(Continued)

*Primary Examiner* — Nelson Garces
(74) *Attorney, Agent, or Firm* — Slater Matsil, LLP

(57) ABSTRACT

A method includes forming a redistribution structure over a carrier, the redistribution structure having conductive features on a surface of the redistribution structure distal the carrier; forming a conductive pillar over the surface of the redistribution structure; attaching a die to the surface of the redistribution structure adjacent to the conductive pillar, where die connectors of the die are electrically coupled to the conductive features of the redistribution structure; and attaching a pre-made substrate to the conductive pillar through a conductive joint, where the conductive joint is on the conductive pillar and comprises a different material from the conductive pillar, where the conductive joint and the conductive pillar electrically couple the redistribution structure to the pre-made substrate.

20 Claims, 31 Drawing Sheets

Related U.S. Application Data division of application No. 15/908,417, filed on Feb. 28, 2018, now Pat. No. 10,867,924.

(60) Provisional application No. 62/529,237, filed on Jul. 6, 2017.

(51) Int. Cl.

| | | |
|---|---|---|
| *H01L 23/00* | (2006.01) | |
| *H01L 23/31* | (2006.01) | |
| *H01L 23/498* | (2006.01) | |
| *H01L 25/00* | (2006.01) | |
| *H01L 25/10* | (2006.01) | |
| *H01L 21/48* | (2006.01) | |
| *H01L 25/065* | (2023.01) | |

(52) U.S. Cl.
CPC .. *H01L 23/49811* (2013.01); *H01L 23/49827* (2013.01); *H01L 23/49833* (2013.01); *H01L 23/5389* (2013.01); *H01L 24/16* (2013.01); *H01L 24/19* (2013.01); *H01L 24/20* (2013.01); *H01L 24/32* (2013.01); *H01L 24/73* (2013.01); *H01L 24/81* (2013.01); *H01L 24/83* (2013.01); *H01L 24/92* (2013.01); *H01L 24/95* (2013.01); *H01L 25/105* (2013.01); *H01L 25/50* (2013.01); *H01L 21/486* (2013.01); *H01L 23/49816* (2013.01); *H01L 23/5384* (2013.01); *H01L 25/0655* (2013.01); *H01L 25/0657* (2013.01); *H01L 2224/16225* (2013.01); *H01L 2224/16227* (2013.01); *H01L 2224/19* (2013.01); *H01L 2224/211* (2013.01); *H01L 2224/32225* (2013.01); *H01L 2224/48091* (2013.01); *H01L 2224/73204* (2013.01); *H01L 2224/73265* (2013.01); *H01L 2224/81801* (2013.01); *H01L 2224/83104* (2013.01); *H01L 2224/83855* (2013.01); *H01L 2224/92125* (2013.01); *H01L 2224/95* (2013.01); *H01L 2225/0651* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01)

(58) Field of Classification Search
CPC ............... H01L 2224/06515–06519; H01L 2224/022–02215; H01L 2224/0391; H01L 2224/03916; H01L 2224/1148; H01L 2224/1191; H01L 2224/11916; H01L 2224/2748; H01L 2224/2791; H01L 2224/27916; H01L 2224/0903; H01L 2224/09051–09055; H01L 2224/091–09183; H01L 2224/09515–09519; H01L 2224/03–03921; H01L 2224/1403; H01L 2224/141–14183; H01L 2224/14051; H01L 2224/15–17519; H01L 2224/13075–13084; H01L 2224/1601–16014; H01L 2224/1605–1607; H01L 2224/161–16268; H01L 2224/165–16507; H01L 24/03; H01L 21/76802–76817; H01L 21/76841–76883; H01L 2224/48091; H01L 2924/00014; H01L 2924/181; H01L 2924/00012

See application file for complete search history.

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,867,924 B2 * | 12/2020 | Jeng | H01L 24/32 |
| 2008/0017968 A1 * | 1/2008 | Choi | H01L 25/03 |
| | | | 257/E23.18 |
| 2009/0008765 A1 | 1/2009 | Yamano et al. | |
| 2009/0154132 A1 | 1/2009 | Okamoto et al. | |
| 2011/0291288 A1 | 12/2011 | Wu et al. | |
| 2011/0304015 A1 * | 12/2011 | Kim | H01L 25/0657 |
| | | | 257/532 |
| 2012/0193789 A1 | 8/2012 | Hu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0168856 A1 | 7/2013 | Wang et al. | |
| 2013/0307140 A1 | 11/2013 | Huang et al. | |
| 2014/0077361 A1 * | 3/2014 | Lin | H01L 23/5389 |
| | | | 257/737 |
| 2014/0131858 A1 | 5/2014 | Pan et al. | |
| 2014/0151867 A1 | 6/2014 | Lin et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0001708 A1 * | 1/2015 | Lin | H01L 25/50 |
| | | | 257/737 |
| 2015/0319848 A1 * | 11/2015 | Furutani | H05K 1/115 |
| | | | 361/783 |
| 2016/0240508 A1 | 8/2016 | Hou et al. | |
| 2016/0316573 A1 | 10/2016 | Hu | |
| 2017/0148778 A1 | 5/2017 | Hou et al. | |
| 2018/0204820 A1 | 7/2018 | Zhai et al. | |

FOREIGN PATENT DOCUMENTS

| | | |
|---|---|---|
| KR | 20080056016 A | 6/2008 |
| KR | 20140035803 A | 3/2014 |
| KR | 20170075213 A | 7/2017 |

* cited by examiner

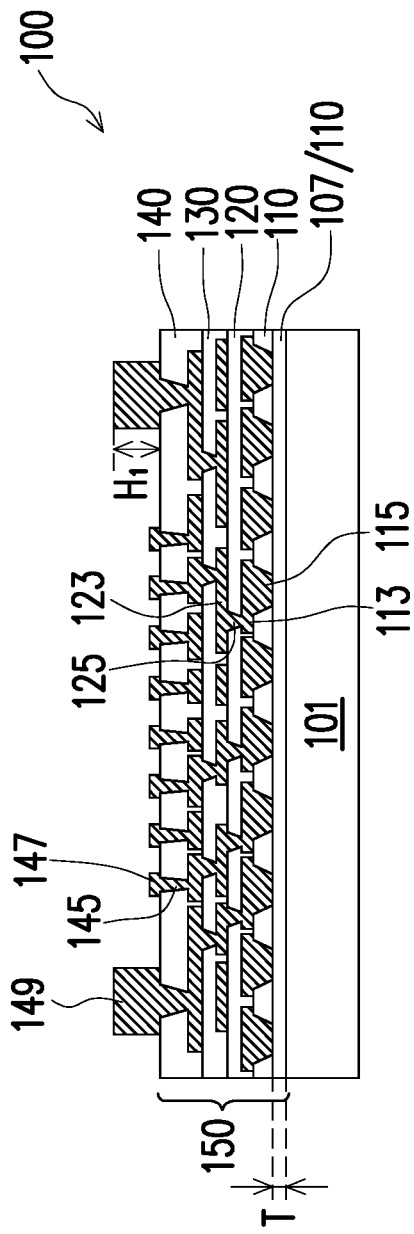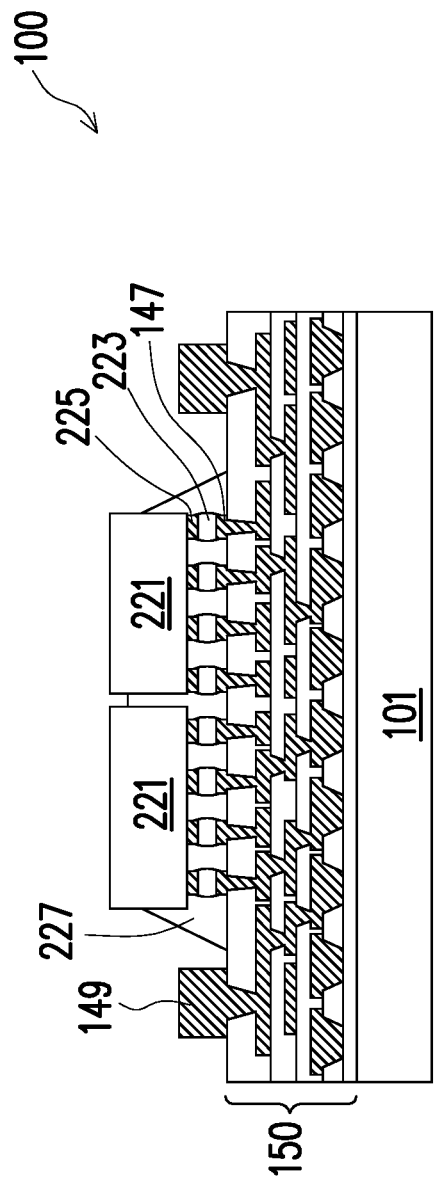

SEMICONDUCTOR PACKAGE WITH DUAL SIDES OF METAL ROUTING

PRIORITY CLAIM AND CROSS-REFERENCE

This application is a continuation of U.S. patent application Ser. No. 16/569,850, filed Sep. 13, 2019, entitled "Semiconductor Package with Dual Sides of Metal Routing," which is a divisional of U.S. patent application Ser. No. 15/908,417, filed Feb. 28, 2018, entitled "Semiconductor Package with Dual Sides of Metal Routing," now U.S. Pat. No. 10,867,924, issued Dec. 15, 2020, which claims priority to U.S. Provisional Patent Application No. 62/529,237, filed Jul. 6, 2017, entitled "Semiconductor Package with Dual Sides of Metal Routing," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-5, 6A and 6B illustrate cross-sectional views of a semiconductor device at various stages of fabrication, in accordance with an embodiment.

DETAILED DESCRIPTION

Figure 3:
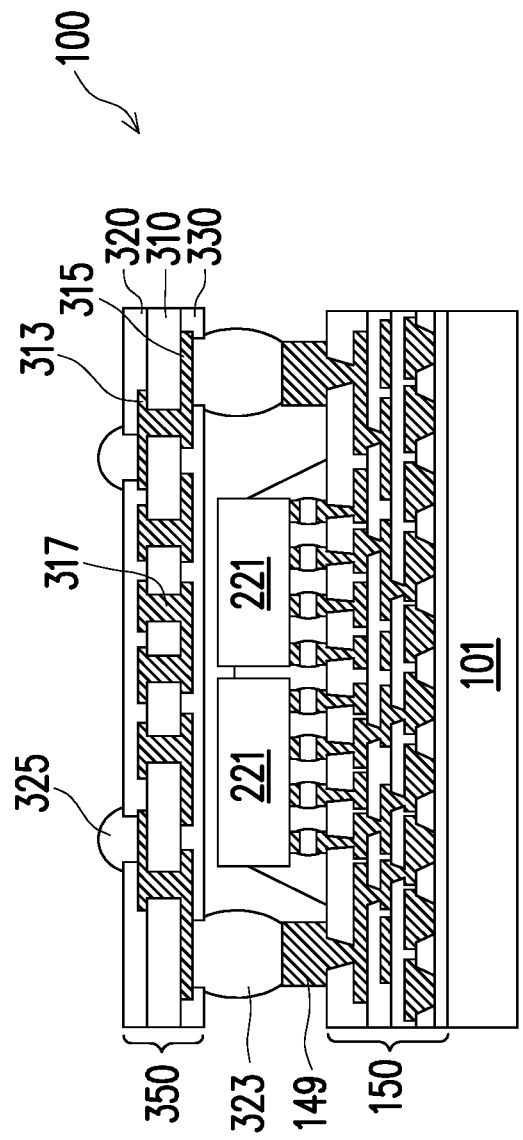

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming the semiconductor devices are provided in various embodiments. In some embodiments, the semiconductor device includes a redistribution structure, one or more semiconductor dies with the front sides of the semiconductor dies attached to the redistribution structure, and a substrate attached to the back sides of the one or more semiconductor dies. The substrate includes one or more redistribution layers for re-routing electrical signals, and is electrically coupled to the redistribution structure and/or the one or more semiconductor dies, in some embodiments. In other embodiments, the substrate includes dummy metal patterns that are electrically isolated. The substrate attached to the back sides of the one or more semiconductor dies may help to balance the metal density on both sides (e.g., front side and the back side) of the semiconductor dies, thereby reducing warpage of the semiconductor device.

FIGS. 1-5, 6A and 6B illustrate cross-sectional views of a semiconductor device 100 at various stages of fabrication, in accordance with an embodiment. In FIG. 1, a redistribution structure 150 is formed over a carrier 101. The redistribution structure 150 comprises conductive features (e.g., conductive lines and vias) formed in one or more dielectric layers. Conductive pillars 149 are formed over the upper surface of the redistribution structure 150 and are electrically coupled to the redistribution structure 150.

The carrier 101 may be made of a material such as silicon, polymer, polymer composite, metal foil, ceramic, glass, glass epoxy, beryllium oxide, tape, or other suitable material for structural support. The redistribution structure 150 is formed over the carrier 101. The redistribution structure 150 comprises conductive features, such as one or more layers of conductive lines (e.g., 113, 123) and vias (e.g., 125, 145), and one or more dielectric layers (e.g., 107, 110, 120, 130, 140). In some embodiments, the one or more dielectric layers 107/110/120/130/140 are formed of a polymer, such as polybenzoxazole (PBO), polyimide, benzocyclobutene (BCB), or the like. In other embodiments, the dielectric layers 107/110/120/130/140 are formed of a nitride such as silicon nitride, an oxide such as silicon oxide, phosphosilicate glass (PSG), borosilicate glass (BSG), boron-doped phosphosilicate glass (BPSG), or the like. The one or more dielectric layers 107/110/120/130/140 may be formed by any acceptable deposition process, such as spin coating, chemical vapor deposition (CVD), laminating, the like, or a combination thereof.

In some embodiments, the conductive features of the redistribution structure 150 comprise conductive lines (e.g., 113, 123), conductive vias (e.g., 125, 145) formed of a suitable conductive material such as copper, titanium, tungsten, aluminum, or the like. The conductive features may also include conductive pads (e.g., 147) that are used to connect to electrical components or devices (see, e.g., FIG. 2). Conductive vias 115 are later exposed (see, e.g., FIG. 5) and used as conductive pads to connect to electrical components or devices, thus may also be referred to as conductive pads 115. In some embodiments, the conductive lines 113 and the conductive pads 115 are formed by forming openings in the dielectric layer 110, forming a seed layer (not shown) over the dielectric layer 110 and in the openings, forming a patterned photoresist (not shown) with a designed pattern over the seed layer, plating (e.g., electroplating or electroless plating) the conductive material in the designed pattern and over the seed layer, and removing the photoresist and portions of seed layer on which the conductive material is not formed.

Note that in the illustrated example of FIG. 1, the dielectric layer 107, which may serve as a buffer layer, is formed over the carrier 101 before the dielectric layer 110 is formed. In other embodiments, the dielectric layer 107 is not formed before the dielectric layer 110, and instead, is formed as portions of the dielectric layer 110. In other words, the dielectric layer 107 and the dielectric layer 110 illustrated in FIG. 1 may be one continuous dielectric layer 110 formed in a same deposition process, in which case the openings in the dielectric layer 110 do not extend through the dielectric layer 110, thus portions of the dielectric layer 110 are disposed between the bottom surfaces of the conductive pads 115 and the carrier 101.

In some embodiments, an adhesive layer (not shown) is deposited or laminated over the carrier 101 before the redistribution structure 150 is formed. The adhesive layer may be photosensitive and may be easily detached from the carrier 101 by shining, e.g., an ultra-violet (UV) light on the carrier 101 in a subsequent carrier de-bonding process. For example, the adhesive layer may be a light-to-heat-conversion (LTHC) coating made by 3M Company of St. Paul, Minnesota.

After the conductive lines 113 and the conductive pads 115 are formed, additional dielectric layers and additional conductive features may be formed by performing similar processing as described above for forming the dielectric layer 110 and the conductive features (e.g., 113 and 115). The vias (e.g., 125, 145) over the dielectric layer 110 are electrically coupled to respective underlying conductive features. FIG. 1 also illustrates the conductive pads 147 formed over the upper surface of the redistribution structure 150 (e.g., over the upper surface of the dielectric layer 140), which may be used to connect to, e.g., semiconductor dies 221 (see FIG. 2). Although four dielectric layers are illustrated in FIG. 1, more or less than four dielectric layers may be used for the redistribution structure 150.

Still referring to FIG. 1, conductive pillars 149 are formed over the redistribution structure 150. The conductive pillars 149 may be formed by: forming a seed layer over the redistribution structure 150; forming a patterned photoresist over the seed layer, where each of the openings in the patterned photoresist corresponds to a location of the conductive pillar 149 to be formed; filling the openings with an electrically conductive material such as copper using, e.g., electroplating or electroless plating; removing the photoresist using, e.g., an ashing or a stripping process; and removing portions of the seed layer on which the conductive pillars 149 are not formed. Note that in the example of FIG. 1, a height $H_1$ of the conductive pillars 149 is formed to be small, such that an upper surface of the conductive pillar 149 is lower (e.g., closer to the redistribution structure 150) than an upper surface of the semiconductor die 221 (see FIG. 2) subsequently attached to the redistribution structure 150.

Next, in FIG. 2, one or more semiconductor dies 221 (may also be referred to as dies, or integrated circuit (IC) dies) are mechanically and electrically coupled to the conductive pads 147 on the upper surface of the redistribution structure 150. Conductive bumps 225 (may also be referred to as die connectors) of the semiconductor dies 221, which may be copper pillars or other suitable connectors, are mechanically and electrically coupled to the conductive pads 147 via conductive regions 223. In some embodiments, the conductive regions 223 are solder regions (e.g., solder bumps).

Before being adhered to the redistribution structure 150, the dies 221 may be processed according to applicable manufacturing processes to form integrated circuits in the dies 221. For example, the dies 221 may each include a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The dies 221 further comprise pads (not shown), such as aluminum pads, to which external connections are made. The pads are on what may be referred to as active sides or front sides of the dies 221. Passivation film(s) (not shown) are formed on the dies 221 and on portions of the pads. Openings are through the passivation film(s) to the pads. Die connectors 225, such as conductive pillars (for example, comprising a metal such as copper), are in the openings through passivation film(s) and are mechanically and electrically coupled to the respective pads. The die connectors 225 may be formed by, for example, plating, or the like. The die connectors 225 are electrically coupled to the integrated circuits of the dies 221.

A dielectric material (not shown in FIG. 2, see, e.g., 228 in FIG. 19) is formed on the active sides of the dies 221, such as on the passivation film(s) and/or the die connectors 225. The dielectric material laterally encapsulates the die connectors 225, and the dielectric material is laterally coterminous with the respective die 221. The dielectric material may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

As illustrated in FIG. 2, after the dies 221 are attached to the redistribution structure 150, an underfill material 227 is formed to fill a gap between the semiconductor dies 221 and the redistribution structure 150. The underfill material 227 may also fill or partially fill a gap between the semiconductor dies 221, and gaps between the conductive pillars 149 and the semiconductor dies 221. Example materials of the underfill material 227 include, but are not limited to, polymers and other suitable non-conductive materials. The underfill material 227 may be dispensed in the gap between the semiconductor dies 221 and the redistribution structure 150 using, e.g., a needle or a jetting dispenser. A curing process may be performed to cure underfill material 227.

Although two dies 221 are illustrated in FIG. 2, more or less than two dies 221 may be used to form the semiconductor device 100. In addition, although conductive pillars 149 are illustrated to be formed along perimeters of the semiconductor device 100, the conductive pillars 149 may be formed between the dies 221. These and other variations are fully intended to be included within the scope of the present disclosure.

Next, in FIG. 3, a substrate 350, which is pre-made, is attached to the conductive pillars 149 by conductive joints 323. In some embodiments, the substrate 350 is a printed circuit board (PCB). In other embodiment, the substrate 350 is an interposer.

In the illustrated example of FIG. 3, the substrate 350 includes a core 310, which is formed of a dielectric material such as resin or fiber glass. For example, the core 310 may include bismaleimide triazine (BT) resin, FR-4 (a composite material composed of woven fiberglass cloth with an epoxy resin binder that is flame resistant), ceramic, glass, plastic, tape, film, or other supporting materials. Conductive features 313 and 315, such as copper lines and/or copper pads, are formed on opposing sides of the core 310 and may serve as redistribution layers to re-route electrical signals from a first location(s) of the substrate 350 to a second location(s) of the substrate 350. Conductive vias 317 extend through the core 310, and are electrically coupled to the conductive features 313/315. FIG. 3 also illustrates a dielectric layer 320 (e.g., a solder resist layer) on the upper surface of the core 310 and over the conductive features 313. Openings may be formed in the dielectric layer 320, which openings expose portions of the conductive features 313. External connectors 325, such as solder bumps, may be formed in the openings and electrically coupled to the conductive features 313. The external connectors 325 may be used to connect the substrate 350 to another device, such as a memory chip. FIG. 3 further illustrates a dielectric layer 330 (e.g., a solder resist layer) on the lower surface of the core 310 and over the conductive feature 315. Openings are formed in the dielectric layer 330, which openings expose portions of the conductive features 315. The substrate 350 does not have active components (e.g., transistors), in the illustrated embodiment.

In some embodiments, the conductive joints 323 are solder regions. For example, solder paste may be formed on the conductive pillars 149 (e.g., copper pillars) and/or on respective exposed conductive features 315 of the substrate 350; the substrate 350 is attached to the conductive pillars 149 by the solder paste; and a reflow process is then performed to melt the solder paste to form the solder regions 323. Therefore, the solder regions 323 extend from the conductive pillars 149, through the dielectric layer 330, to conductive features 315 of the substrate 350, in some embodiments. In the illustrated example of FIG. 3, after the solder regions 323 are formed, the lower surface of the substrate 350 is above the upper surfaces of the dies 221 and does not contact the dies 221.

The structure of the substrate 350 in FIG. 3 is for illustration purpose and not limiting. The substrate 350 may have other structures. For example, the core 310 of the substrate 350 may not be a single-layer core as illustrated in FIG. 3, instead, the core 310 may comprise a plurality of dielectric layers, and multiple layers of conductive lines and/or vias may be formed in the plurality of dielectric layers. These and other variations of the substrate 350 are fully intended to be included within the scope of the present disclosure.

Figure 4:
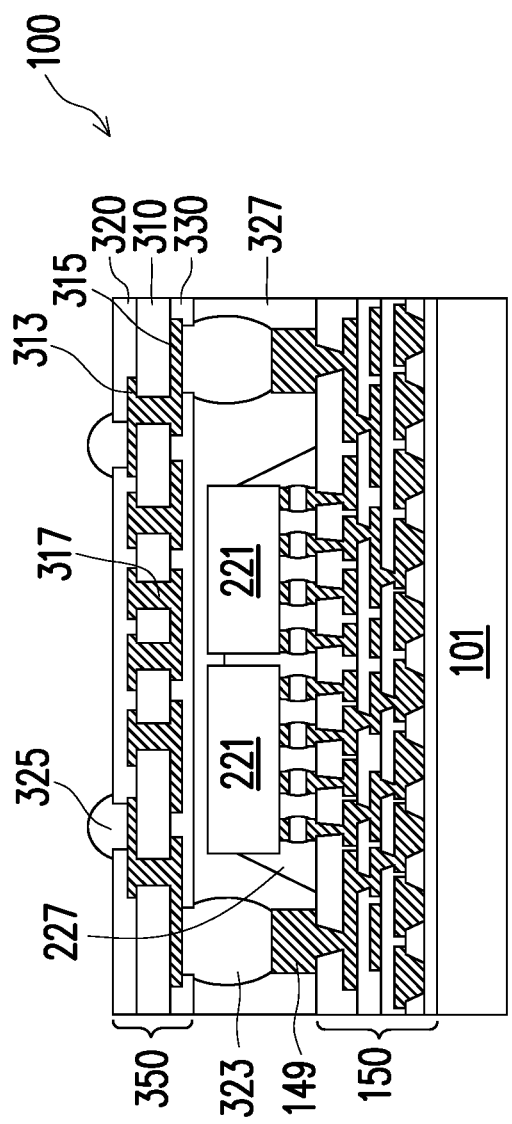

Next, in FIG. 4, a molding material 327 is formed to fill a space between the substrate 350 and the dies 221/the redistribution structure 150. The molding material 327 may comprise an epoxy, an organic polymer, a polymer with or without a silica-based or glass filler added, or other materials, as examples. In some embodiments, the molding material 327 comprises a liquid molding compound (LMC) that is a gel type liquid when applied. The molding material 327 may also comprise a liquid or solid when applied. Alternatively, the molding material 327 may comprise other insulating and/or encapsulating materials. The molding material 327 is applied using a wafer level molding process in some embodiments. The molding material 327 may be molded using, for example, compressive molding, transfer molding, or other methods.

Next, the molding material 327 is cured using a curing process, in some embodiments. The curing process may comprise heating the molding material 327 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 327 may be cured using other methods. In some embodiments, a curing process is not included. The molding material 327 is different from the underfill material 227, in the illustrated embodiment.

Figure 5:
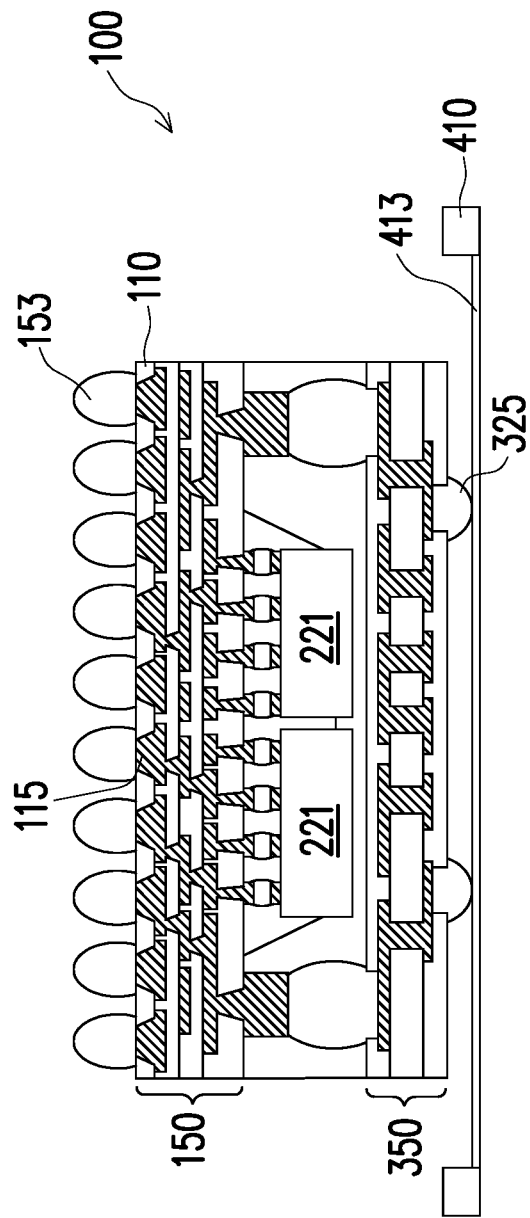

Next, in FIG. 5, the semiconductor device 100 is flipped over, and the external connectors 325 are attached to a tape 413 supported by a frame 410. The tape 413 may be a dicing tape, which may be adhesive, for holding the semiconductor device 100 in place in subsequent processing. Next, the carrier 101 is detached (de-bonded) from the semiconductor device 100 through a de-bonding process. The de-bonding process may remove the carrier 101 using any suitable process, such as etching, grinding, and mechanical peel off. In embodiments where an adhesive layer such as LTHC film is used between the carrier 101 and the redistribution structure 150, the carrier 101 is de-bonded by shining a laser or UV light over the surface of the carrier 101. The laser or UV light breaks the chemical bonds of the adhesive layer that binds to the carrier 101, and the carrier 101 can then be easily detached.

Next, the dielectric layer 110 (or the dielectric layer 107, if formed) is recessed to expose the conductive pads 115. An etching process, such as a chemical mechanical polish (CMP) process, the like, or combinations thereof may be used to expose the conductive pads 115, in some embodiments. In other embodiments, a laser drilling process, a photolithography and/or etching process, or the like, may be used to expose the conducive pads 115. Thereafter, external connectors 153 are formed over the conductive pads 115. In some embodiments, the external connectors 153 are conductive bumps such as microbumps and may comprise a material such as tin, or other suitable materials, such as silver or copper. In an embodiment in which the external connectors 153 are tin solder bumps, the external connectors 153 may be formed by initially forming a layer of tin through any suitable method such as evaporation, electroplating, printing, solder transfer, or ball placement. Once a layer of tin has been formed on the structure, a reflow is performed in order to shape the material into the desired bump shape with a diameter of about, e.g., 20 µm, although any suitable size may alternatively be utilized.

However, as one of ordinary skill in the art will recognize, while external connectors 153 have been described above as microbumps, these are merely intended to be illustrative and are not intended to limit the embodiments. Rather, any suitable type of external connectors, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 153, and all such external connectors are fully intended to be included within the scope of the embodiments.

Figure 6A:
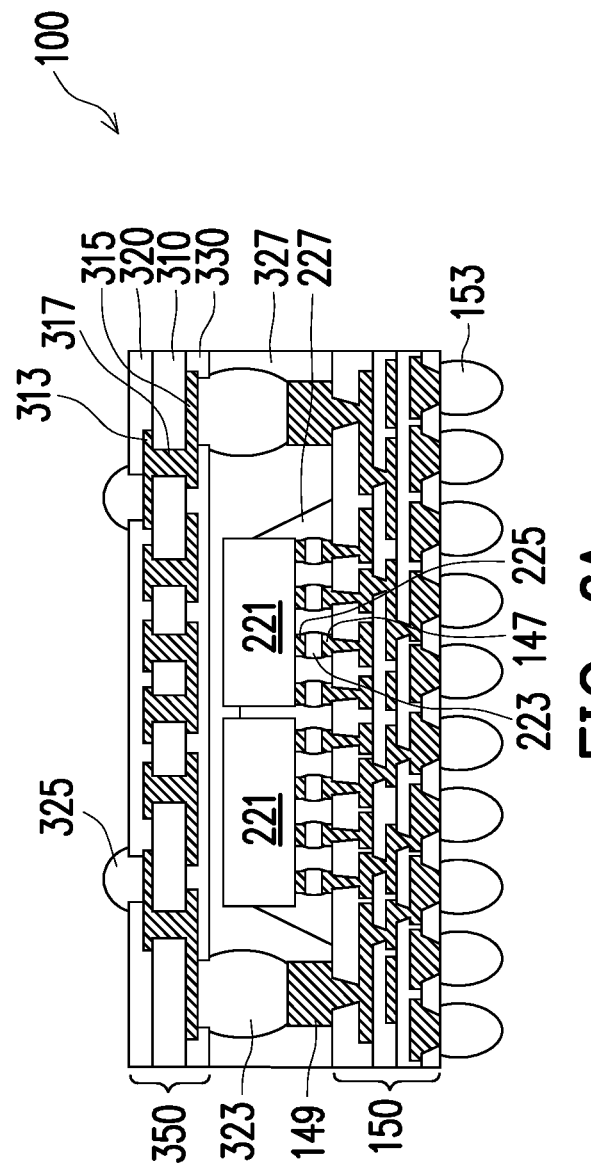

Although not shown, a dicing processing may be performed after the external connectors 153 are formed to separate the semiconductor device 100 from other neighboring semiconductor devices (not shown) formed in the same processing steps as the semiconductor device 100, thereby forming a plurality of individual semiconductor devices. FIG. 6A illustrates the semiconductor device 100 after the dicing process.

Figure 6B:
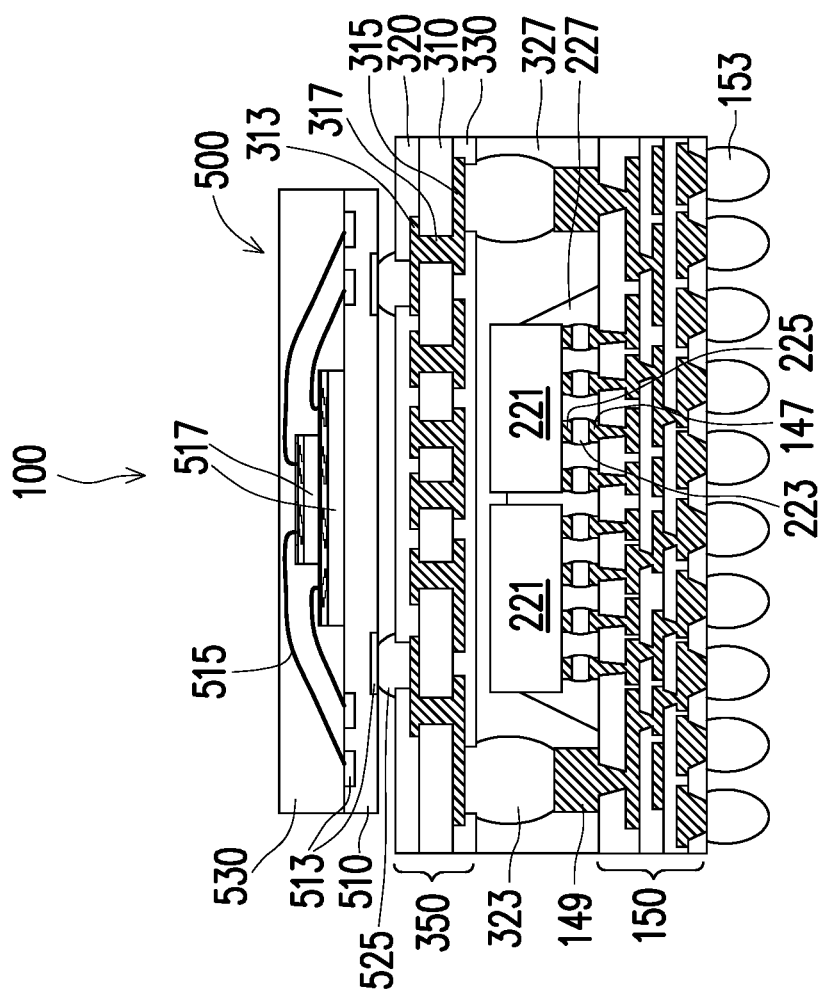

Next, as shown in FIG. 6B, a semiconductor device 500, such as a memory device, may be attached to the semiconductor device 100 shown in FIG. 6A to form the semiconductor device 100 in FIG. 6B, thereby forming a semiconductor package with a package-on-package (PoP) structure. As illustrated in FIG. 6B, the semiconductor device 500 has a substrate 510 and one or more semiconductor dies 517 attached to an upper surface of the substrate 510.

In some embodiments, the substrate 510 includes silicon, gallium arsenide, silicon on insulator ("SOI") or other similar materials. In some embodiments, substrate 510 is a multiple-layer circuit board. In some embodiments, substrate 510 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 510 may include conductive features (e.g., conductive lines and vias, not shown) formed in/on the substrate 510. As illustrated in FIG. 6B, the substrate 510 has conductive pads 513 formed on the upper surface and a lower surface of the substrate 510, which conductive pads 513 are electrically coupled to the conductive features of the substrate 510. The one or more semiconductor dies 517 are electrically coupled to the conductive pads 513 by, e.g., bonding wires 515. A molding material 530, which may comprise an epoxy, an organic polymer, a polymer, or the like, is formed over the substrate 510 and around the semiconductor dies 517. The semiconductor device 500 is electrically and mechanically coupled to the substrate 350 by conductive joints 525, which may be formed by bonding external connectors of the semiconductor device 500 with the external connectors 325 of the substrate 350. In some embodiments, the conductive joints 525 comprise solder regions, conductive pillars (e.g., copper pillars), or any other suitable conductive joints. Although not illustrated, the semiconductor device 500 may be bonded with other embodiment devices, such as semiconductor devices 200, 300, and 400 discussed hereinafter, to form various PoP packages in similar ways as illustrated in FIG. 6B.

Figure 7:
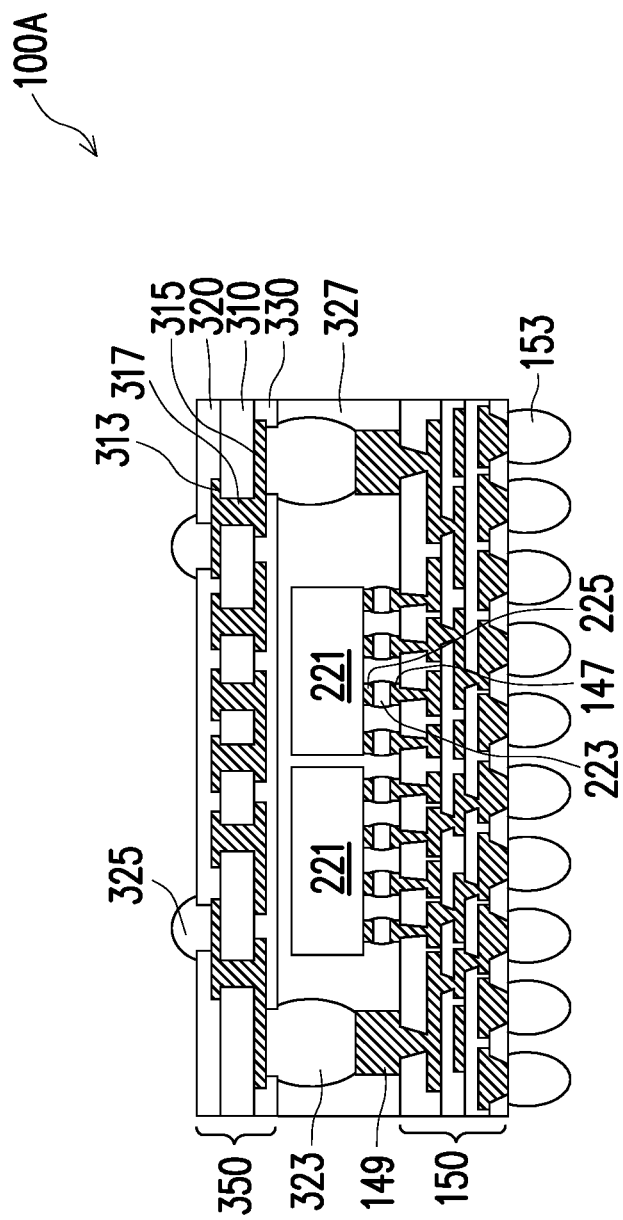
FIG. 7 illustrates a cross-sectional view of a semiconductor device, in accordance with an embodiment.
Figure 8:
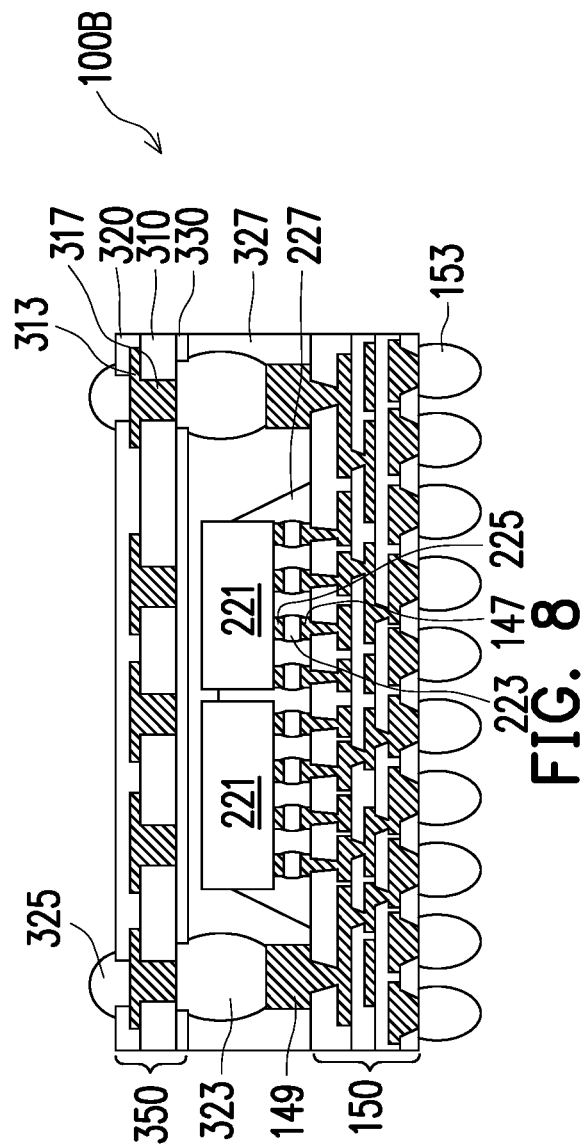
FIG. 8 illustrates a cross-sectional view of a semiconductor device, in accordance with an embodiment.
Figure 9:
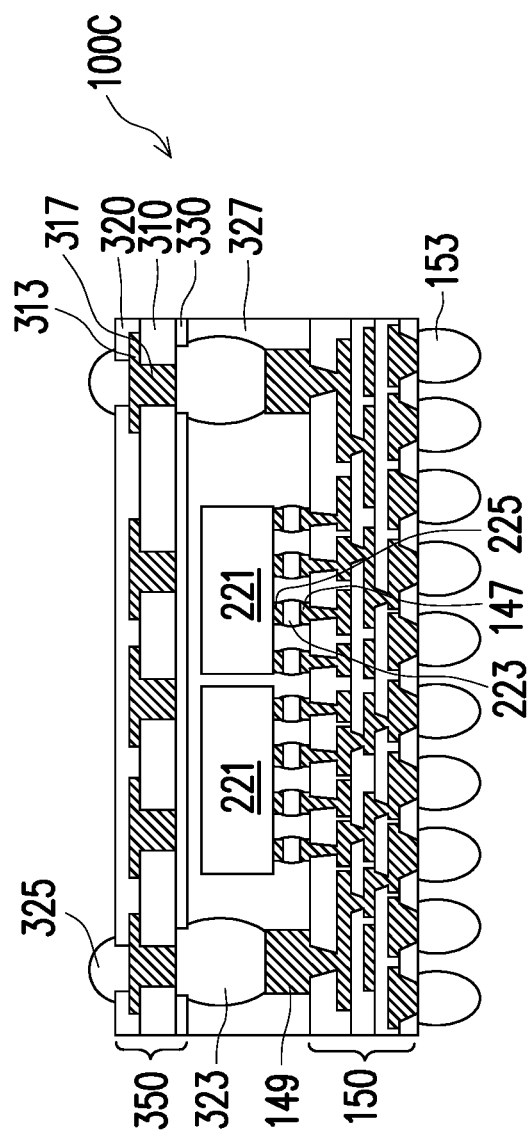
FIG. 9 illustrates a cross-sectional view of a semiconductor device, in accordance with an embodiment.

FIGS. 7-9 illustrate cross-sectional views of semiconductor devices that are similar to the semiconductor device 100 and may be formed using similar processing as illustrated in FIGS. 1-6A, but with modifications, in various embodiments. For example, a molded underfill (MUF) may be used to fill the gap between the dies 221 and the redistribution structure 150, and to fill the space between the redistribution structure 150/the dies 221 and the substrate 350 (see FIGS. 7 and 9) in one processing step, thereby reducing processing time and cost. As another example, the design of the substrate 350 may be simplified to have a redistribution layer (e.g., conductive lines) on one side of the core 310 instead of both sides of the core 310. Further details of the semiconductor devices in FIGS. 7-9 are discussed below.

Referring to FIG. 7, an embodiment semiconductor device 100A is shown which is similar to the semiconductor device 100 as illustrated in FIG. 6A, but without the underfill material 227. In particular, to form the semiconductor device 100A, the underfill material 227 is not formed in the processing step of FIG. 2. Instead, after the substrate 350 is attached to the conductive pillars 149 (see FIG. 3), a molded underfill (MUF) material is used as the molding material 327 to fill the gap between the dies 221 and the redistribution structure 150, and to fill the space between the redistribution structure 150/the dies 221 and the substrate 350 in the processing step shown in FIG. 4, thus filling the gap and the space described above in one processing step, thereby reducing the processing time and manufacturing cost.

In some embodiments, the MUF material 327 of FIG. 7 differs from the underfill material 227 of FIG. 4, in that the fillers in the MUF material 327 are finer (e.g., having smaller sizes) than the fillers in the underfill material 227 to facilitate flow of the MUF into small gaps. In addition, the MUF material may also have a higher percentage of the fillers than the underfill material 227 to control (e.g., lower) the coefficient of thermal expansion (CTE) of the MUF material.

FIG. 8 illustrates another embodiment semiconductor device 100B, which is similar to the semiconductor device 100 in FIG. 6A, but with a different structure for the substrate 350. In particular, only one side (e.g., the upper side) of the core 310 of the substrate 350 in FIG. 8 has conductive features (e.g., 313) formed thereon, and no conductive feature is formed along the other side (e.g., lower side) of the core 310. The conductive vias 317 are electrically coupled to the conductive features 313 and extends through the core 310.

FIG. 9 illustrates another embodiment semiconductor device 100C, which is similar to the semiconductor device 100B in FIG. 8, but without the underfill material 227 between the dies 221 and the redistribution structure 150. The molding material 327 in FIG. 9 is an MUF material, in some embodiments.

FIGS. 10-15 illustrate cross-sectional views of a semiconductor device 200 at various stages of fabrication, in accordance with an embodiment. Unless otherwise specified, similar numerals in FIGS. 10-15 refer to similar parts in FIGS. 1-6A. For example, components with the same numerals may be formed of the same or similar material, and may be formed using the same or similar formation method. For simplicity, details may not be repeated.

Figure 10:
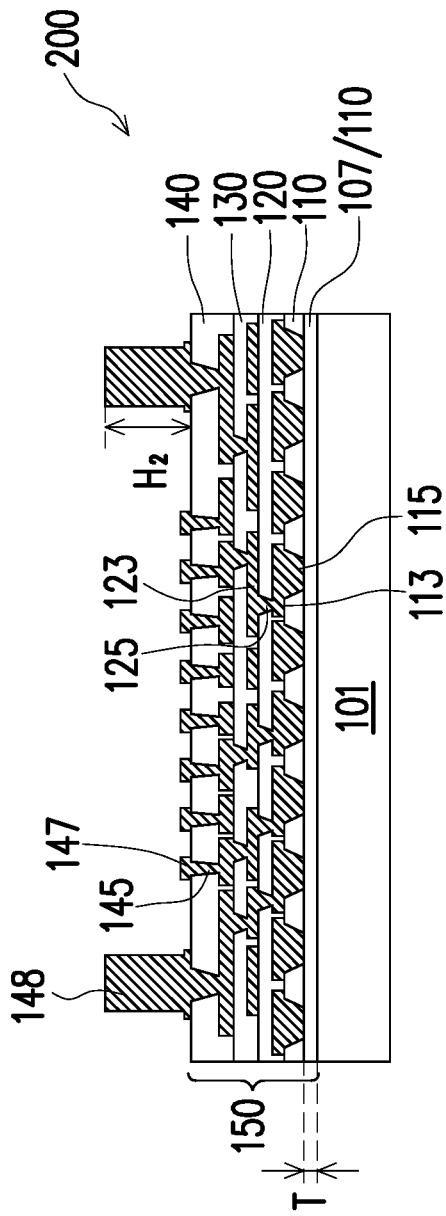
FIGS. 10-15 illustrate cross-sectional views of a semiconductor device at various stages of fabrication, in accordance with an embodiment.

Referring first to FIG. 10, a redistribution structure 150 is formed over the carrier 101. Conductive pillars 148 are formed over the redistribution structure 150, and are mechanically and electrically coupled to the redistribution structure 150. In some embodiments, the conductive pillars 148 comprise a same material as the conductive pillars 149 in FIG. 1 and may be formed using a same method, but with a larger height $H_2$. The height $H_2$ may be equal to or larger than the distance between the upper surface of the dies 221 (see FIG. 11) and the upper surface of the redistribution structure 150.

Figure 11:
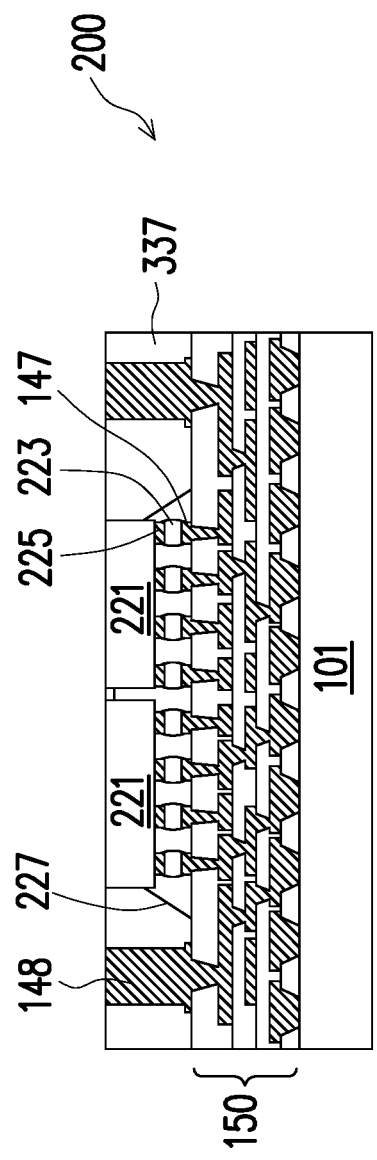

Next, in FIG. 11, one or more dies 221 are attached to the conductive pads 147 of the redistribution structure 150. For example, the die connectors 225 of the dies 221 are coupled to the conductive pads 147 through solder regions 223 by performing a reflow process. After the dies 221 are attached to the redistribution structure 150, the underfill material 227 is formed to fill the gap between the dies 221 and the redistribution structure 150.

Next, a molding material 337 is formed over the upper surface of the redistribution structure 150 around the dies 221, the conductive pillars 148, and the underfill material 227. The molding material 337 may comprise an epoxy, an organic polymer, a polymer with or without a silica-based or glass filler added, or other materials, as examples. In some embodiments, the molding material 337 comprises a liquid molding compound (LMC) that is a gel type liquid when applied. The molding material 337 may also comprise a liquid or solid when applied. Alternatively, the molding material 337 may comprise other insulating and/or encapsulating materials. The molding material 337 is applied using a wafer level molding process in some embodiments. The molding material 337 may be molded using, for example, compressive molding, transfer molding, or other methods.

Next, the molding material 337 is cured using a curing process, in some embodiments. The curing process may comprise heating the molding material 337 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 337 may be cured using other methods. In some embodiments, a curing process is not included. The molding material 337 is different from the underfill material 227, in some embodiments.

After the molding material 337 are formed, a planarization process, such as CMP, may be performed to remove upper portions of the molding material 337 to achieve a coplanar upper surface between the dies 221, the conductive pillars 148, and the molding material 337. The planarization process may also remove top portions of the conductive pillars 148 and/or top portions of the dies 221 (e.g. thinning of the dies 221).

Figure 12:
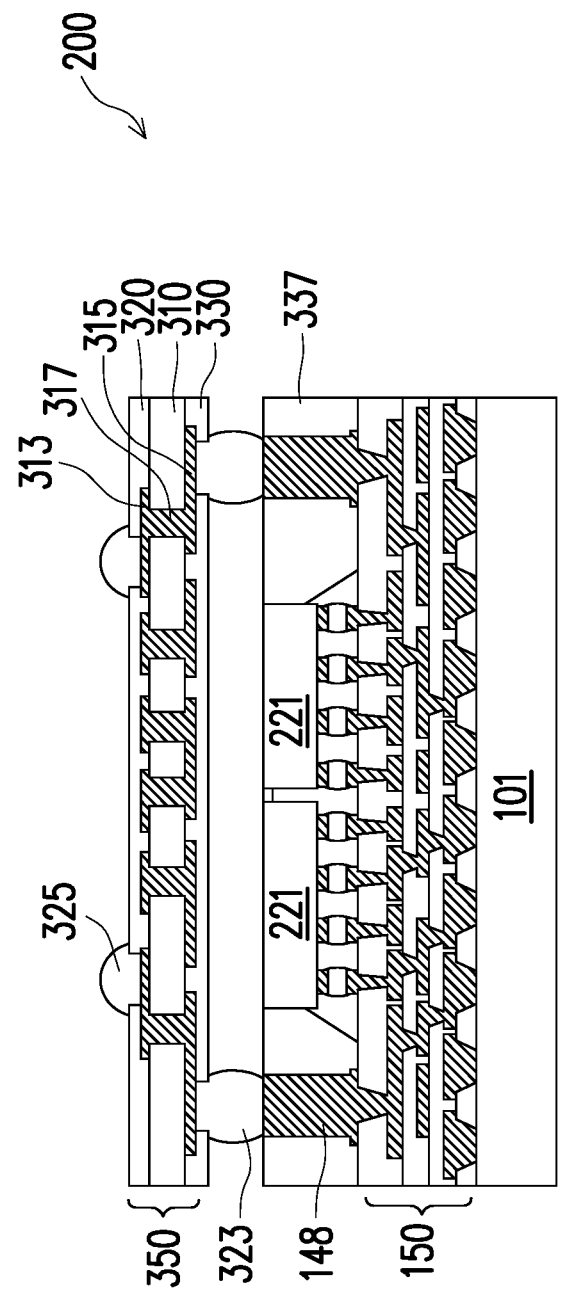

Referring next to FIG. 12, the pre-made substrate 350 is mechanically and electrically coupled to the conductive pillars 148 by the conductive joints 323. For example, a reflow process may be performed to form solder regions between the conductive pillars 148 and the substrate 350 as the conductive joints 323.

Figure 13:
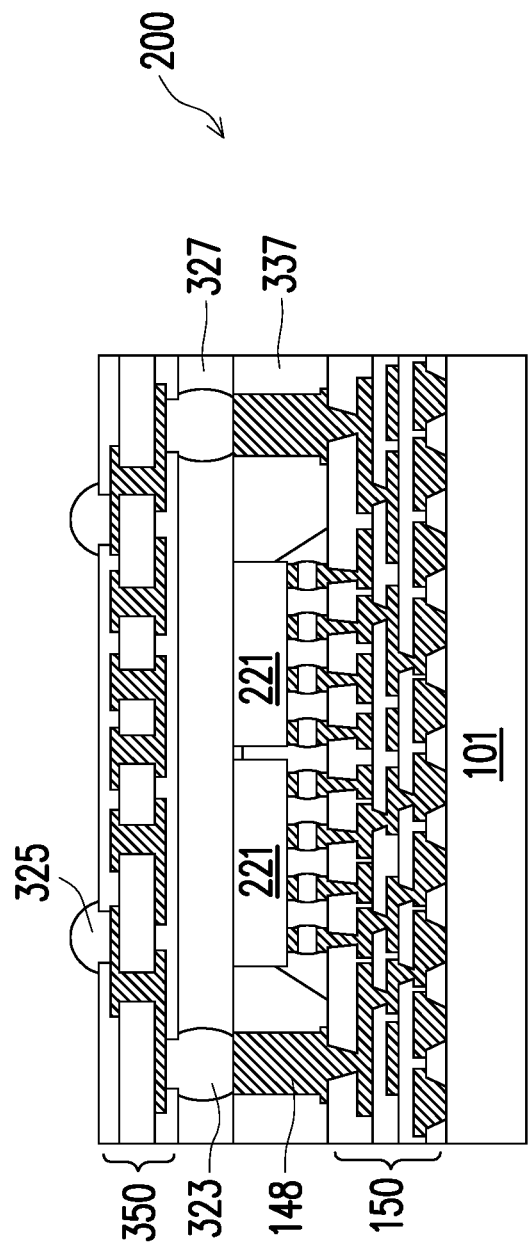

Next, in FIG. 13, a molding material 327 is formed to fill the space between the dies 221 and the substrate 350, and between the molding material 337 and the substrate 350. The molding material 327 is different from the molding material 337, in some embodiments. In addition, the molding material 327 is different from the underfill material 227, in some embodiments.

Figure 14:
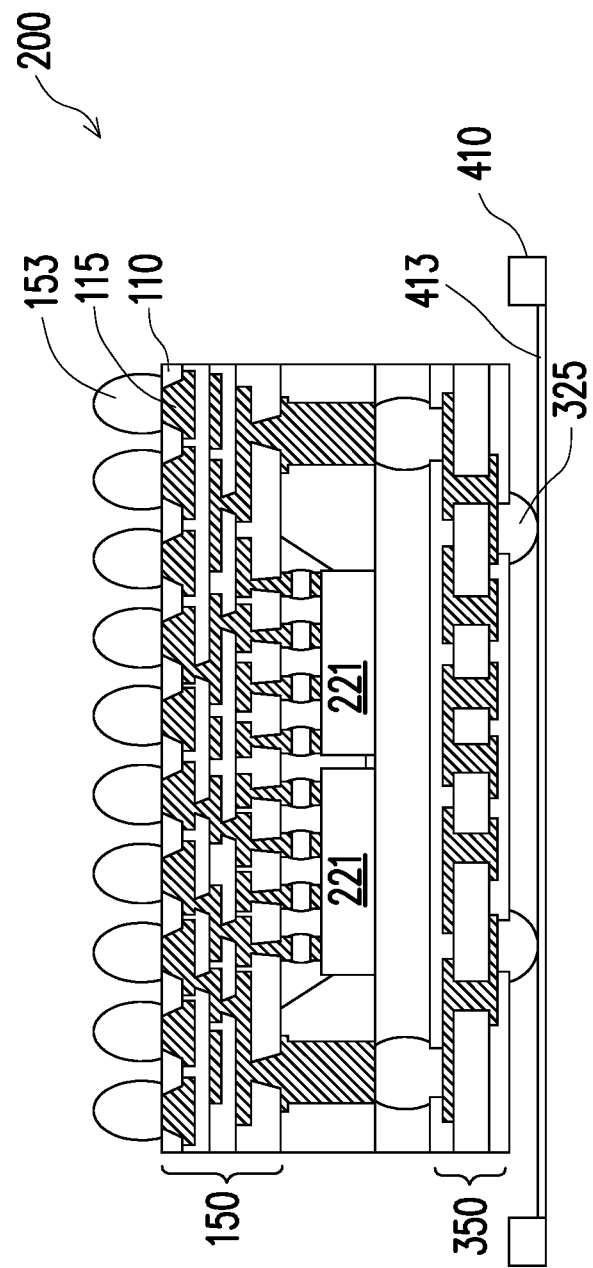

Referring next to FIG. 14, after the molding material 327 is formed, the semiconductor device 200 is flipped over, and the external connectors 325 of the substrate 350 are attached to the tape 413 supported by the frame 410. Next, the carrier 101 is de-bonded, and the dielectric layer 110 is recessed to expose the conductive pads 115. External connectors 153 are then formed over the exposed conducive pads 115.

Although not shown, dicing may be performed to separate the semiconductor device 200 from other neighboring semiconductor devices (not shown). After the dicing, the semiconductor device 200 as illustrated in FIG. 15 is formed.

Figure 15:
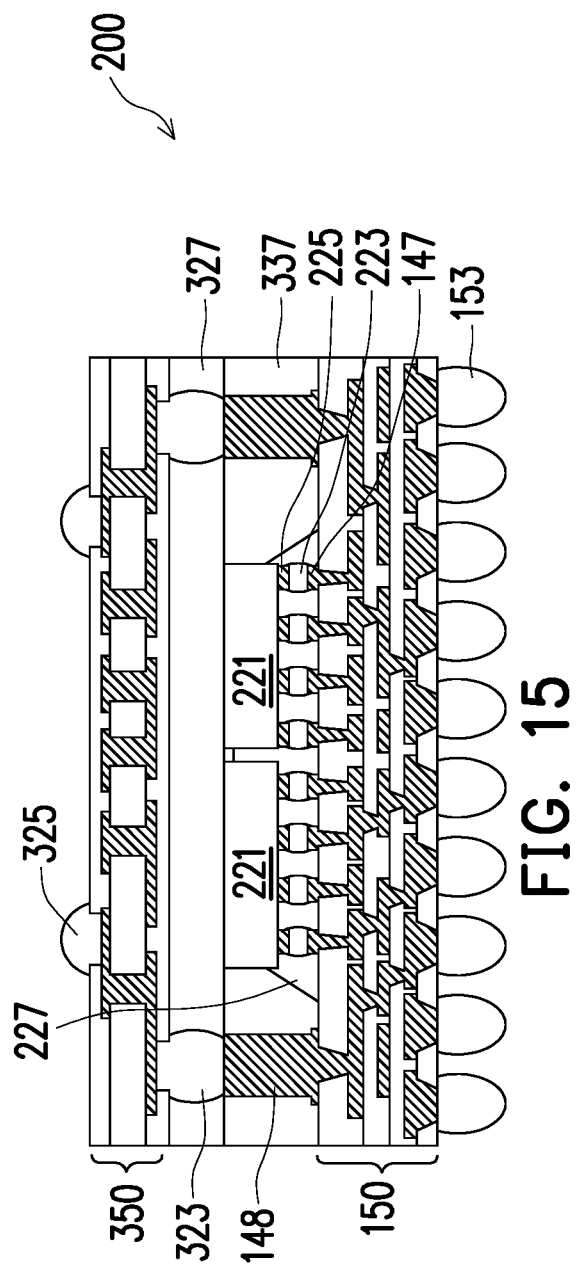
Figure 16:
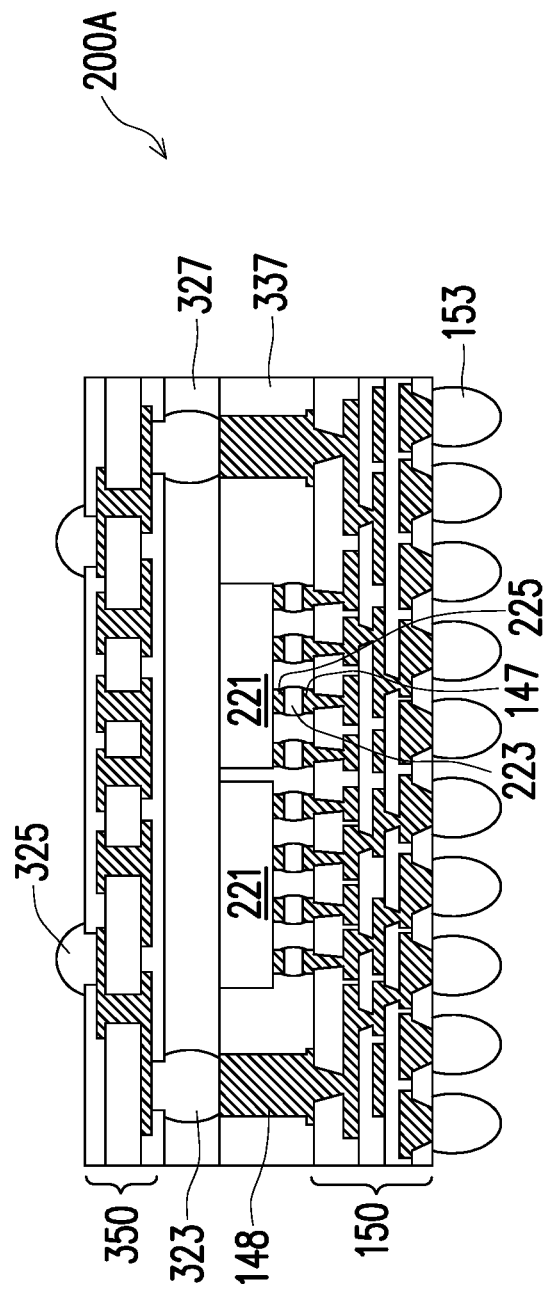
FIG. 16 illustrates a cross-sectional view of a semiconductor device, in accordance with an embodiment.
Figure 17:
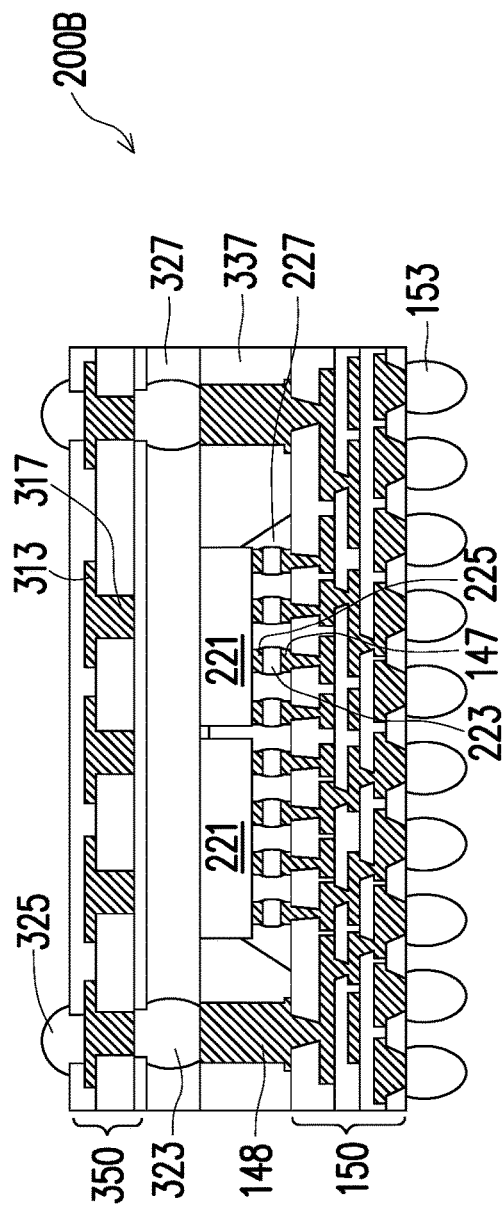
FIG. 17 illustrates a cross-sectional view of a semiconductor device, in accordance with an embodiment.
Figure 18:
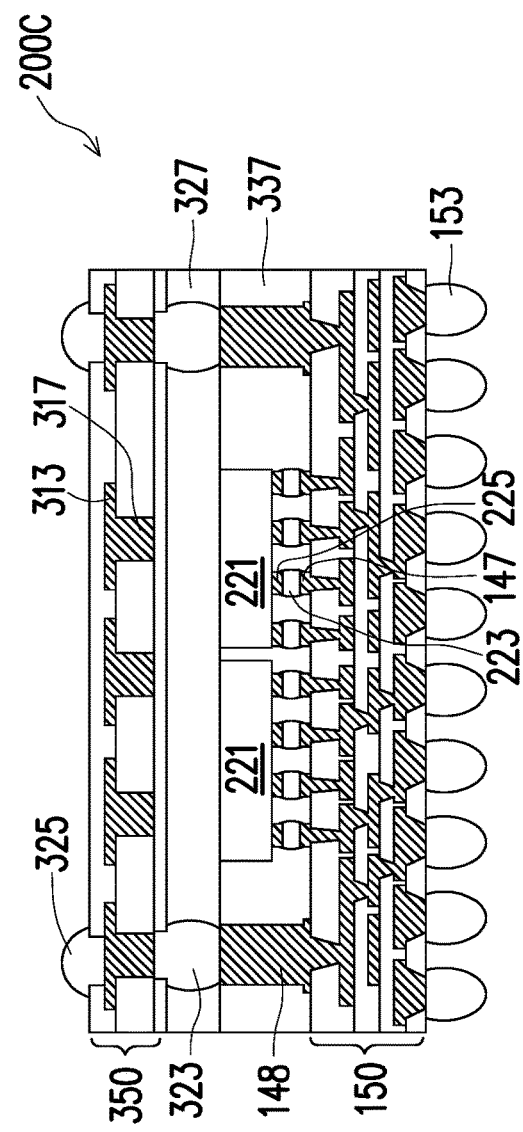
FIG. 18 illustrates a cross-sectional view of a semiconductor device, in accordance with an embodiment.

FIGS. 16-18 illustrate cross-sectional views of semiconductor devices that are similar to the semiconductor device 200 and may be formed using similar processing as illustrated in FIGS. 10-15, but with modifications, in various embodiments. Further details of the semiconductor devices in FIGS. 16-18 are discussed below.

Referring first to FIG. 16, an embodiment semiconductor device 200A is shown which is similar to the semiconductor device 200, but without the underfill material 227. In particular, to form the semiconductor device 200A, the underfill material 227 in FIG. 11 is not formed. Instead, a molded underfill (MUF) material is used as the molding material 337 in the processing step shown in FIG. 1, such that the molding material 337 fills the gap between the dies 221 and the redistribution structure 150, and surrounds the dies 221 and the conductive pillars 148, thereby reducing the processing time and manufacturing cost. The molding material 337 is different from the molding material 327, in some embodiments.

FIG. 17 illustrates another embodiment semiconductor device 200B, which is similar to the semiconductor device 200 in FIG. 15, but with a different structure for the substrate 350. In particular, only one side (e.g., the upper side) of the core 310 of the substrate 350 in FIG. 17 has conductive features (e.g., 313) formed thereon, and no conductive feature is formed along the other side (e.g., lower side) of the core 310. The conductive vias 317 are electrically coupled to the conductive features 313 and extends through the core 310. Although the external connectors 325 are illustrated to be directly over the conductive pillars 148 in FIG. 17, the conductive features 313 (e.g., conductive lines) may redistribute electrical signals to other locations, and therefore, the external connectors 325 may be disposed at other locations.

FIG. 18 illustrates another embodiment semiconductor device 200C, which is similar to the semiconductor device 200B in FIG. 17, but without the underfill material 227 between the dies 221 and the redistribution structure 150. The molding material 337 in FIG. 18 is an MUF material, in some embodiments. The molding material 337 is different from the molding material 327, in some embodiments. Although the external connectors 325 are illustrated to be directly over the conductive pillars 148 in FIG. 18, the conductive features 313 may redistribute electrical signals to other locations, and therefore, the external connectors 325 may be disposed at other locations.

FIGS. 19-22 illustrate cross-sectional views of a semiconductor device 300 at various stages of fabrication, in accordance with an embodiment. Unless otherwise specified, similar numerals in FIGS. 19-22 refer to similar parts in FIGS. 1-6A and/or FIGS. 10-15. For example, components with the same numerals may be formed of the same or similar material, and may be formed using the same or similar formation method. For simplicity, details may not be repeated.

Figure 19:
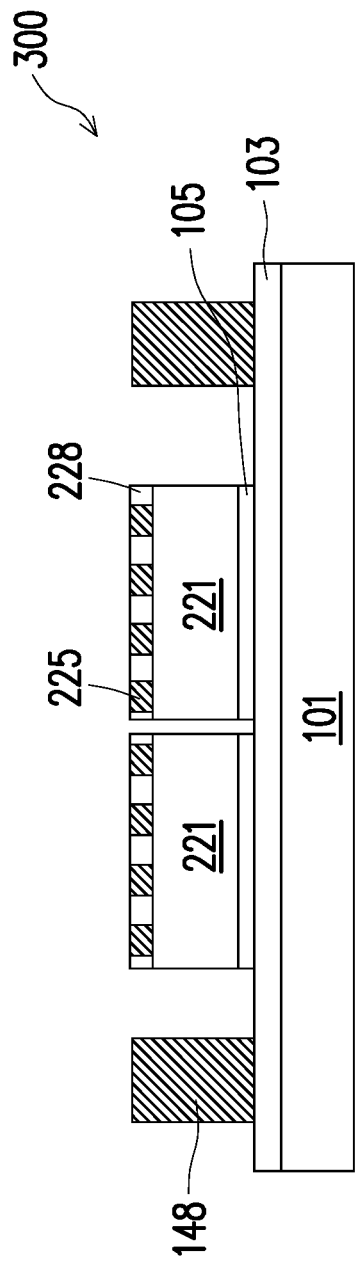
FIGS. 19-22 illustrate cross-sectional views of a semiconductor device at various stages of fabrication, in accordance with an embodiment.

As illustrated in FIG. 19, a dielectric layer 103, which may be a buffer layer, is formed over the carrier 101. In some embodiments, the dielectric layer 103 is formed of polymer, such as polybenzoxazole (PBO), polyimide, benzocyclobutene (BCB), or the like. In other embodiments, the dielectric layer 103 is formed of a nitride such as silicon nitride, an oxide such as silicon oxide, phosphosilicate glass (PSG), borosilicate glass (BSG), boron-doped phosphosilicate glass (BPSG), or the like. The dielectric layer 103 may be formed by a suitable deposition process, such as spin coating, chemical vapor deposition (CVD), laminating, the like, or a combination thereof.

Next, conductive pillars 148, such as copper pillars, are formed over the dielectric layer 103. One or more dies 221 are attached to the dielectric layer 103 by an adhesive layer 105, which may be a suitable dielectric film such as a die attaching film (DAF). FIG. 19 also illustrates the die connectors 225 of the dies 221, and a dielectric layer 228 (e.g., a polymer layer) of the die 221 surrounding the die connectors 225.

Figure 20:
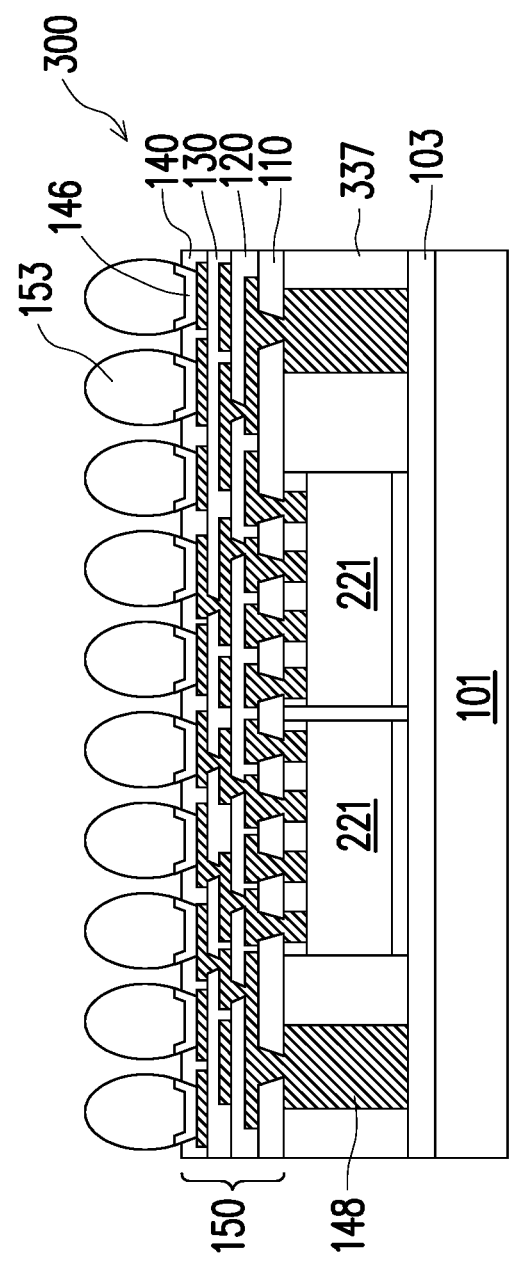

Next, in FIG. 20, a molding material 337 is formed over the dielectric layer 103 around the dies 221 and around the conductive pillars 148. After the molding material 337 are formed, a planarization process, such as CMP, may be performed to remove top portions of the molding material 337 to expose the die connectors 225 of the dies 221. Next, the redistribution structure 150 is formed over the dies 221, the conductive pillars 148, and the molding material 337. The redistribution structure 150 is electrically coupled to the dies 221 and the conductive pillars 148.

FIG. 20 also illustrates under bump metallurgy (UBM) structures 146 formed over and electrically coupled to the redistribution structure 150. In an embodiment, the UBM structures 146 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 146. Any suitable materials or layers of material that may be used for the UBM structures 146 are fully intended to be included within the scope of the present disclosures. Once the UBM structures 146 are formed, external conductors 153, such as solder bumps, are formed over the UBM structures 146.

Figure 21:
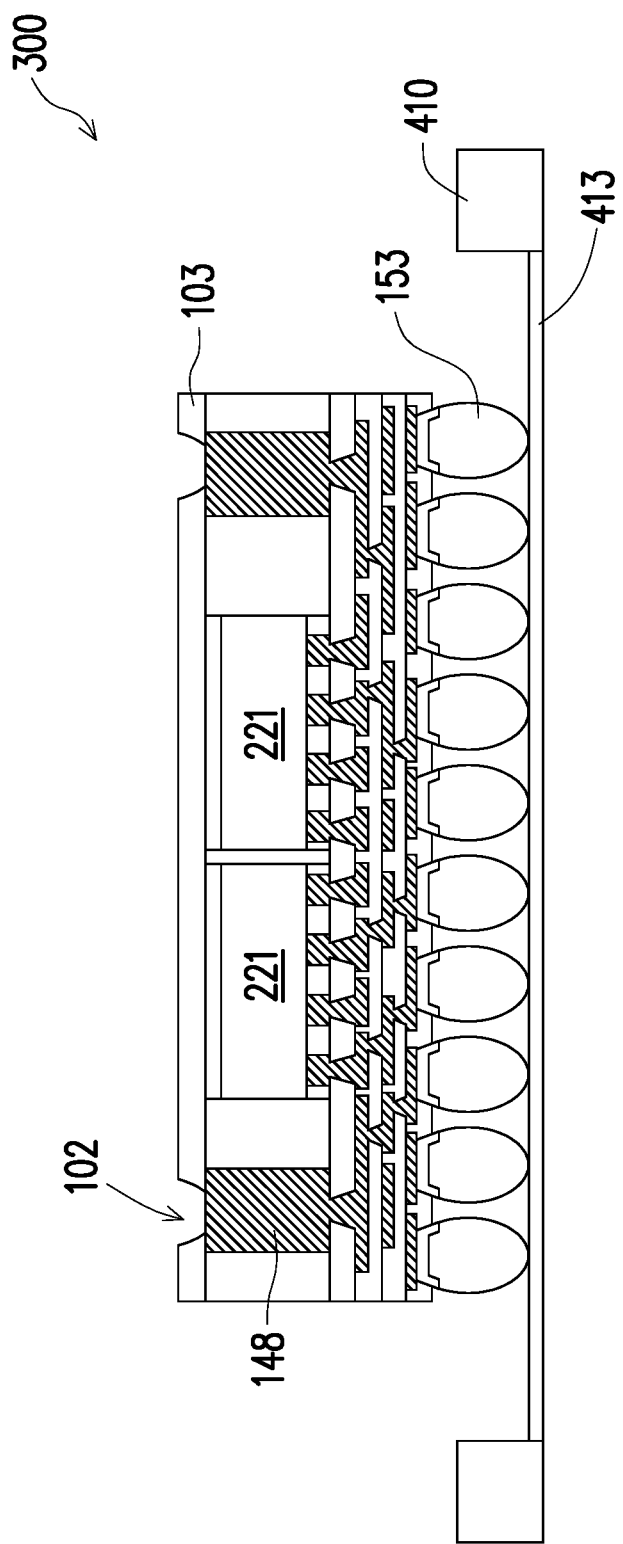

Referring now to FIG. 21, the semiconductor device 300 illustrated in FIG. 20 is flipped over, and the external connectors 153 are attached to the tape 413 supported by the frame 410. Next, the carrier 101 is de-bonded from the semiconductor device 300. Thereafter, openings 102 are formed in the dielectric layer 103. The openings 102 may be formed by a photolithography and/or etching process, although other suitable methods, such as laser drilling, may also be used. As illustrated in FIG. 21, the openings 102 expose the conductive pillars 148.

Figure 22:
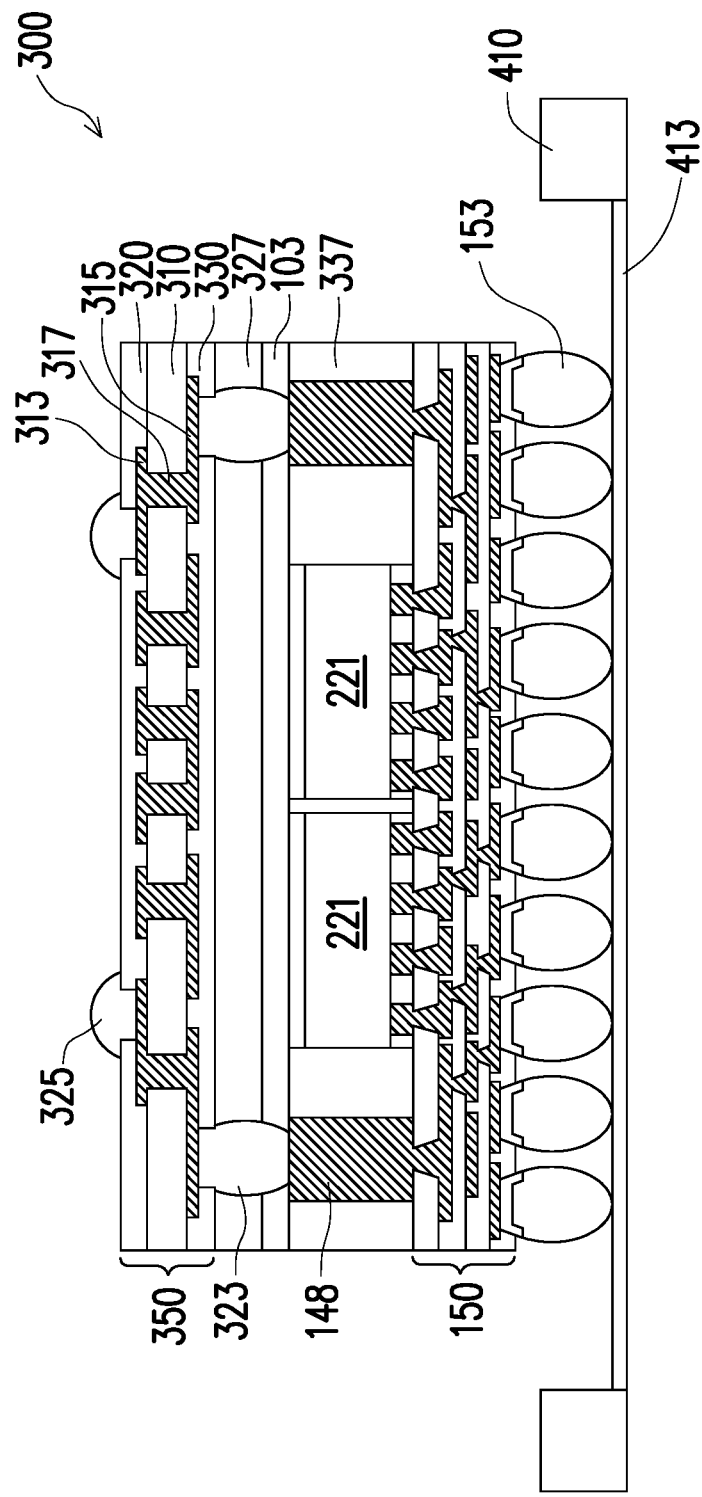

Next, in FIG. 22, the pre-made substrate 350 is attached to the conductive pillars 148. Conductive joints 323, such as solder regions, are formed between the conductive pillars 148 and the substrate 350 to mechanically and electrically couple the substrate 350 to the conductive pillars 148. Next, a molding material 327 is formed to fill a space between the dielectric layer 103 and the substrate 350. The molding material 327 is different from the molding material 337, in some embodiments.

Although not shown, a dicing processing may be performed next to separate the semiconductor device 300 from other neighboring semiconductor devices (not shown) formed in the same processing steps as the semiconductor device 300, thereby forming a plurality of individual semiconductor devices 300.

Figure 23:
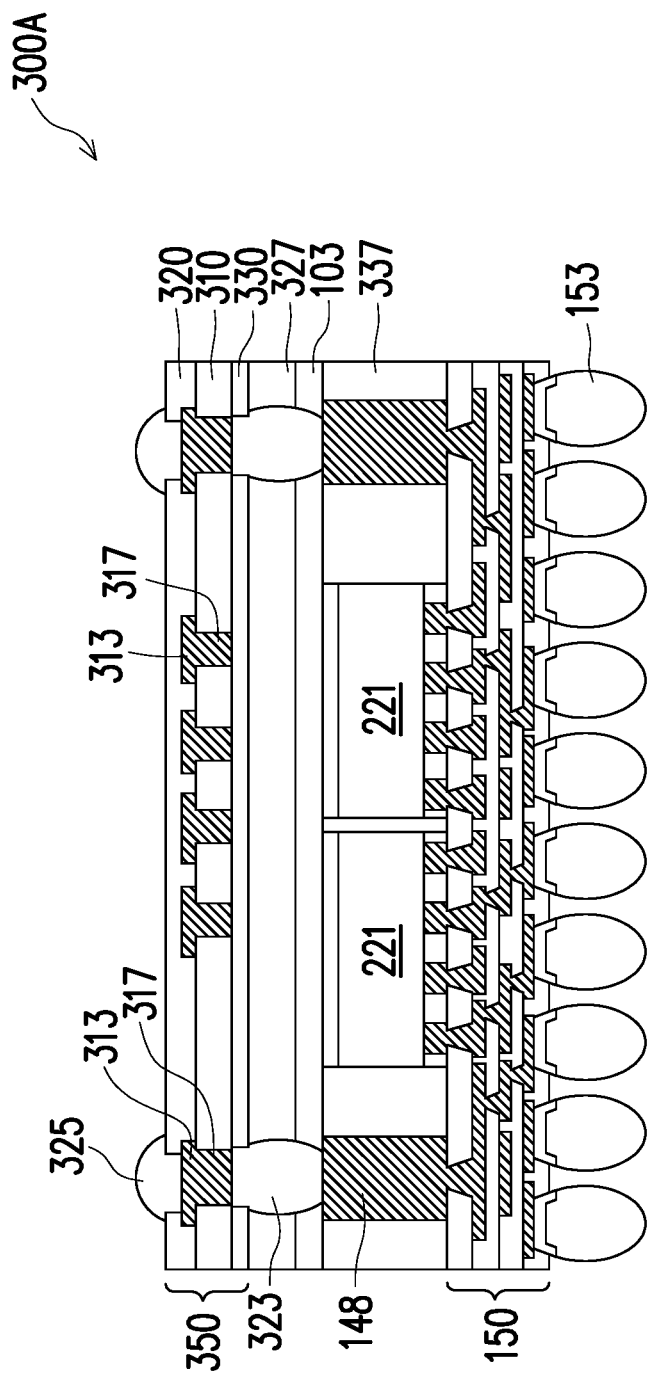
FIG. 23 illustrates a cross-sectional view of a semiconductor device, in accordance with an embodiment.

FIG. 23 illustrates another embodiment semiconductor device 300A, which is similar to the semiconductor device 300 in FIG. 22, but with a different structure for the substrate 350. In particular, only one side (e.g., the upper side) of the core 310 of the substrate 350 in FIG. 23 has conductive features (e.g., 313) formed thereon, and no conductive feature is formed along the other side (e.g., lower side) of the core 310. The conductive vias 317 are electrically coupled to the conductive features 313 and extends through the core 310. Although the external connectors 325 are illustrated to be directly over the conductive pillars 148 in FIG. 23, the conductive features 313 may redistribute electrical signals to other locations, and therefore, the external connectors 325 may be disposed at other locations.

FIGS. 24-27 illustrate cross-sectional views of a semiconductor device 400 at various stages of fabrication, in accordance with an embodiment. Unless otherwise specified, similar numerals in FIGS. 24-27 refer to similar parts in FIGS. 1-6A and/or FIGS. 10-15. For example, components with the same numerals may be formed of the same or similar material, and may be formed using the same or similar formation method. For simplicity, details may not be repeated.

Figure 24:
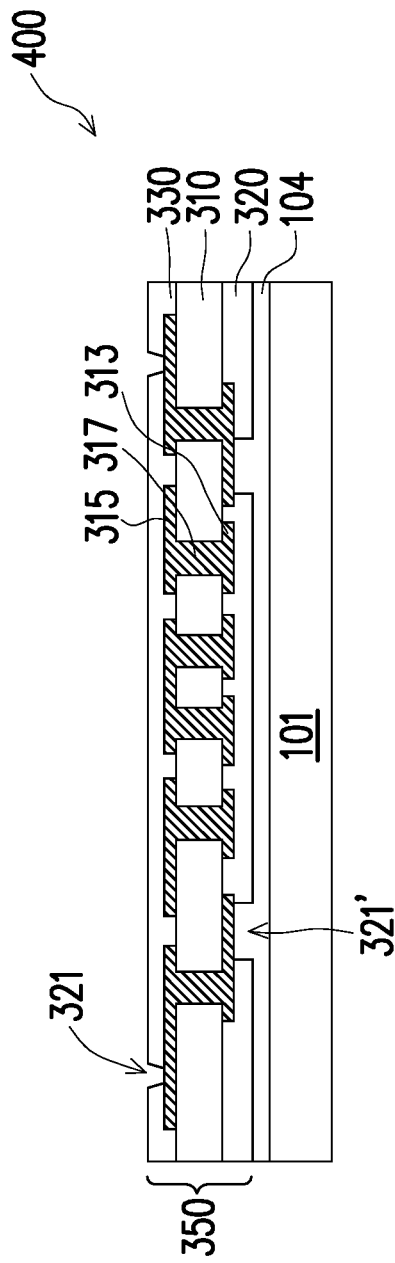
FIGS. 24-27 illustrate cross-sectional views of a semiconductor device at various stages of fabrication, in accordance with an embodiment.

Referring to FIG. 24, the pre-made substrate 350 is attached to the carrier 101 by an adhesive layer 104. The adhesive layer 104 may be photosensitive and may be easily detached from the carrier 101 by shining, e.g., an ultra-violet (UV) light on the carrier 101 in a subsequent carrier de-bonding process. For example, the adhesive layer may be a light-to-heat-conversion (LTHC) coating made by 3M Company of St. Paul, Minnesota.

As illustrated in FIG. 24, the substrate 350 has openings 321 in the dielectric layer 330 and openings 321' in the dielectric layer 320. The openings 321 will be used for electrical connection with the redistribution structure 150 (see FIG. 26), and the openings 321' will be used to for forming the external connectors 325 (see FIG. 27).

Figure 25:
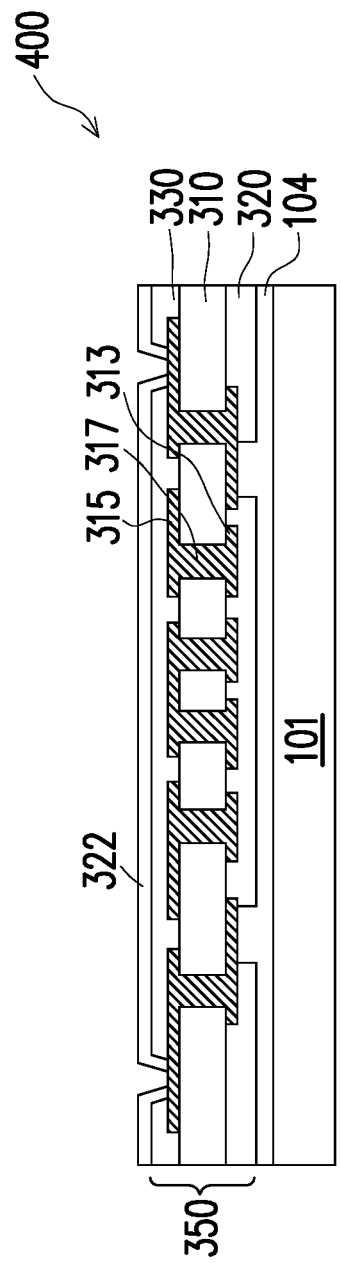

Referring next to FIG. 25, a dielectric layer 322 is formed over the substrate 350. The dielectric layer 322 may comprise a suitable material such as silicon oxide, silicon nitride, silicon oxynitride, the like, or combinations thereof, and may be formed by physical vapor deposition (PVD), CVD, or other suitable method. The dielectric layer 322 may be conformal to the underlying layer. Openings are formed in the dielectric layer 322, e.g., using laser drilling or other suitable methods, to expose portions of the conductive features 315 of the substrate 350, as illustrated in FIG. 25.

Figure 26:
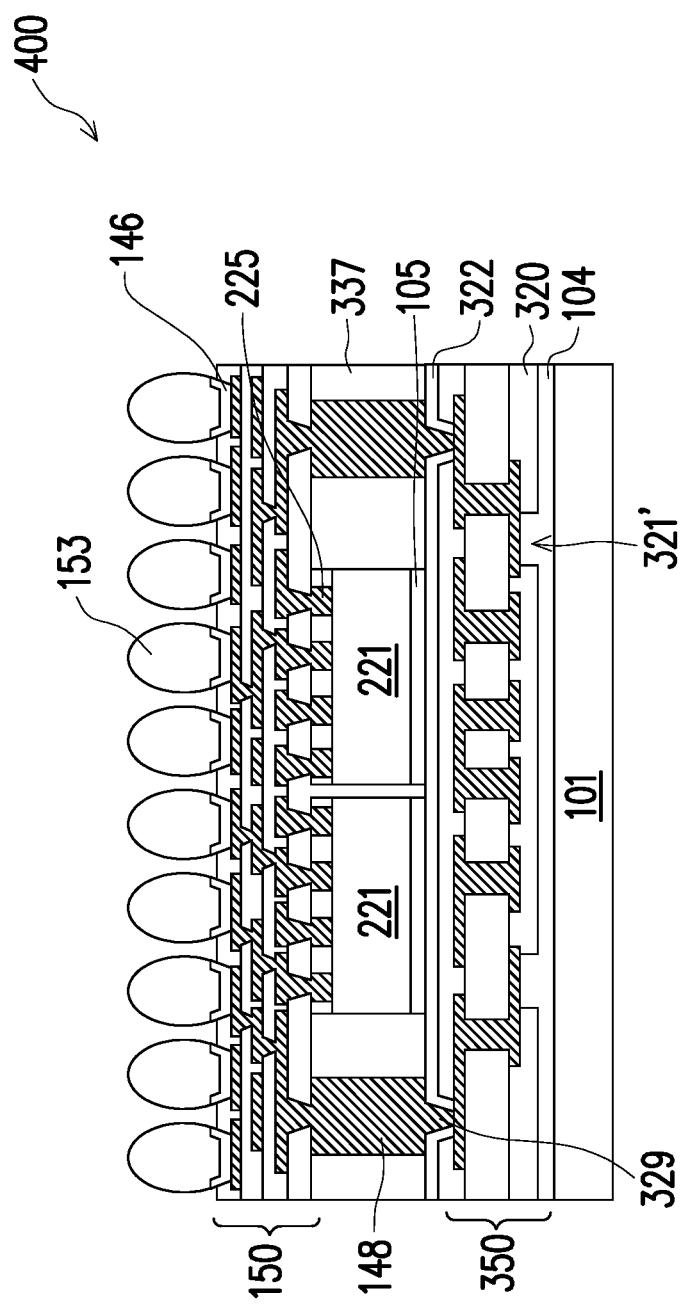

Next, in FIG. 26, conductive pillars 148 are formed over the dielectric layer 322 and are electrically coupled to the substrate 350. As illustrated in FIG. 26, conductive vias 329 are formed in the openings 321 (see FIG. 24) and are electrically coupled between the conductive pillars 148 and the substrate 350. Next, the back sides of one or more dies 221 are attached to the dielectric layer 322 by the adhesive layer 105 (e.g., a DAF). The die connectors 225 on the front sides of the dies 221 are facing upward away from the substrate 350.

Next, a molding material 337 is formed over the dielectric layer 322 and around the dies 221/the conductive pillars 148. A planarization process, such as CMP, may be performed to achieve a planar upper surface between the conductive pillars 148, the molding material 337, and the dies 221. The die connectors 225 are exposed at the upper surface of the molding material 337 after the planarization process.

Next, the redistribution structures 150 are formed over the dies 221, the conductive pillars 148 and the molding material 337. The redistribution structure 150 is mechanically and electrically coupled to the dies 221 and the conductive pillars 148. External connectors 153 are formed over the UBM structures 146, which UBM structures 146 are over and electrically coupled to the redistribution structure 150.

Figure 27:
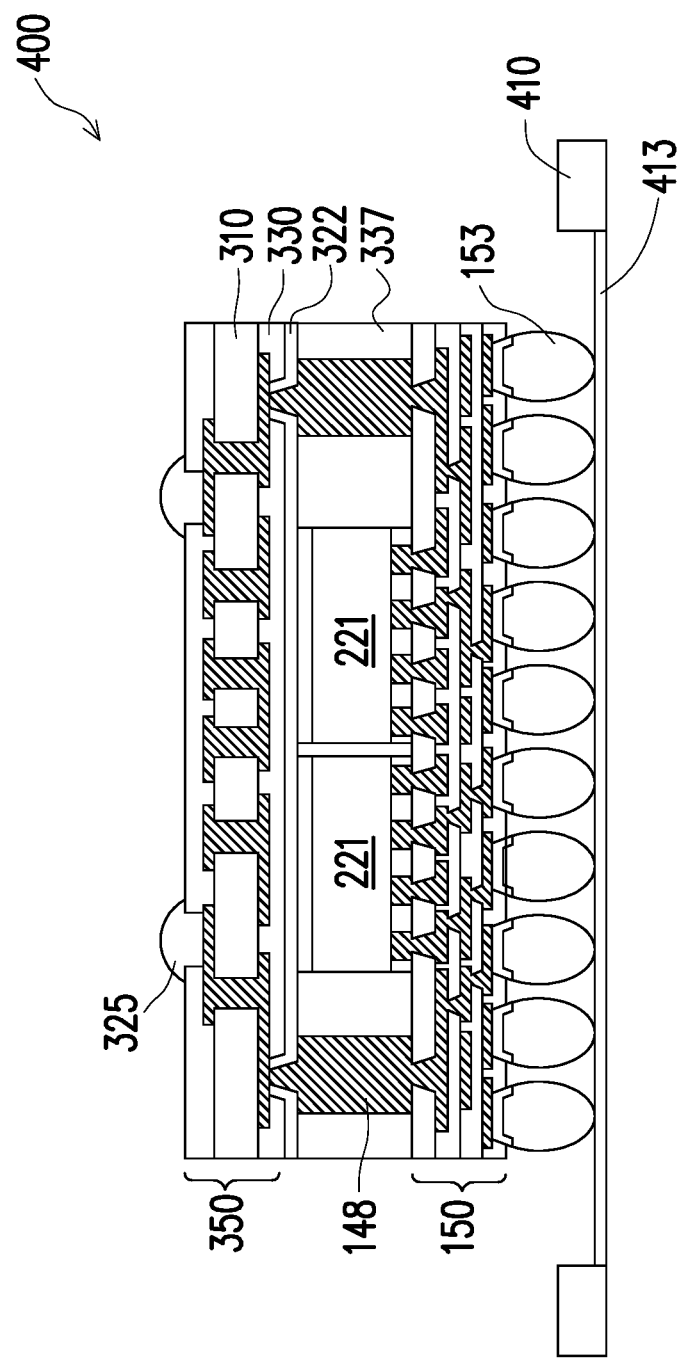

Referring now to FIG. 27, the semiconductor device 400 shown in FIG. 26 is flipped over, and the external connectors 153 are attached to the tape 413 supported by the frame 410. Next, the carrier 101 is de-bonded from the semiconductor device 400. The adhesive layer 104 (see FIG. 26) is removed after the carrier de-bonding process. A cleaning process may be performed after the carrier be-bonding process to remove residues in the openings 321' (see FIG. 26) and/or over the dielectric layer 320.

Next, external connectors 325, such as solder bumps, are formed in the openings 312' (see FIG. 26) to connect to the conductive features of the substrate 350. A dicing process (not shown) may be performed next to separate the semiconductor device 400 from neighboring semiconductor devices.

Figure 28:
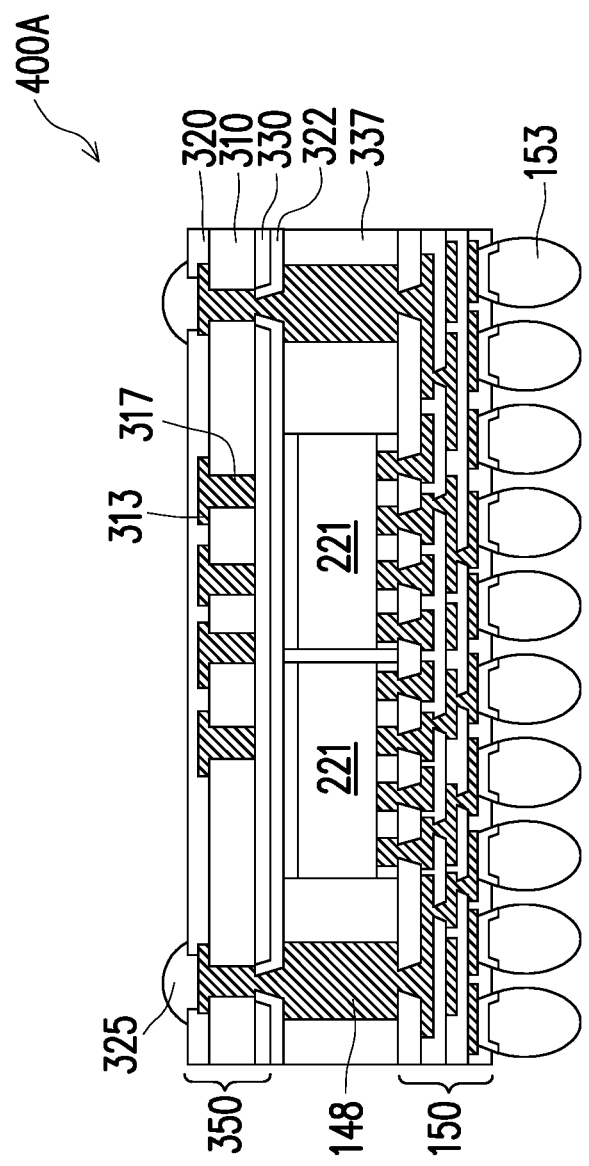
FIG. 28 illustrates a cross-sectional view of a semiconductor device, in accordance with an embodiment.

FIG. 28 illustrates another embodiment semiconductor device 400A, which is similar to the semiconductor device 400 in FIG. 27, but with a different structure for the substrate 350. In particular, only one side (e.g., the upper side) of the core 310 of the substrate 350 in FIG. 28 has conductive features (e.g., 313) formed thereon, and no conductive feature is formed along the other side (e.g., lower side) of the core 310. The conductive vias 317 are electrically coupled to the conductive features 313 and extends through the core 310. Although the external connectors 325 are illustrated to be directly over the conductive pillars 148 in FIG. 28, the conductive features 313 may redistribute electrical signals to other locations, and therefore, the external connectors 325 may be disposed at other locations.

FIGS. 29-32 illustrate cross-sectional views of a semiconductor device 500 at various stages of fabrication, in accordance with an embodiment. Unless otherwise specified, similar numerals in FIGS. 29-32 refer to similar parts in FIGS. 1-6A and/or FIGS. 10-15. For example, components with the same numerals may be formed of the same or similar material, and may be formed using the same or similar formation method. For simplicity, details may not be repeated.

Figure 29:
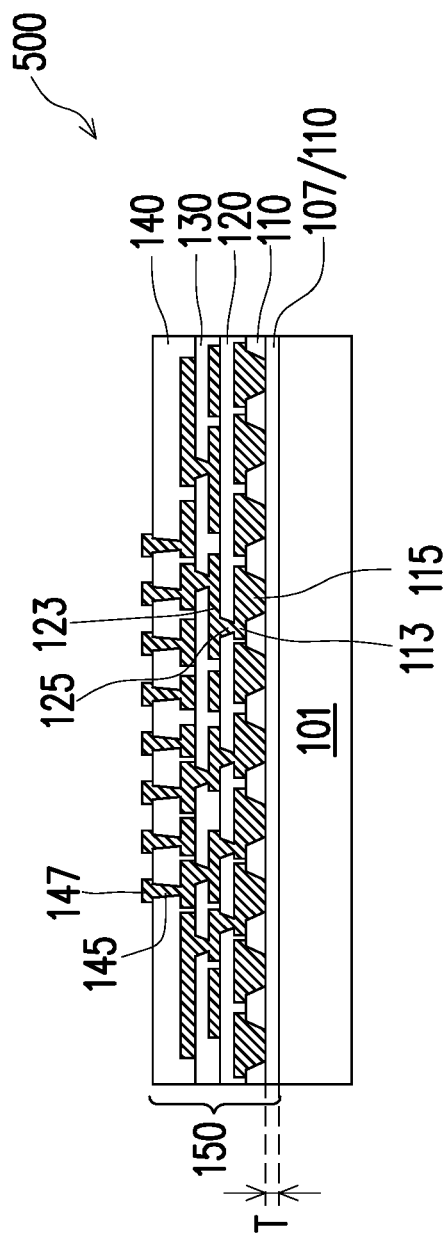
FIGS. 29-32 illustrate cross-sectional views of a semiconductor device at various stages of fabrication, in accordance with an embodiment.

Referring to FIG. 29, the redistribution structure 150 is formed over the carrier 101. The formation method of the redistribution structure 150 is the same or similar to that in FIG. 1, thus is not repeated here.

Figure 30:
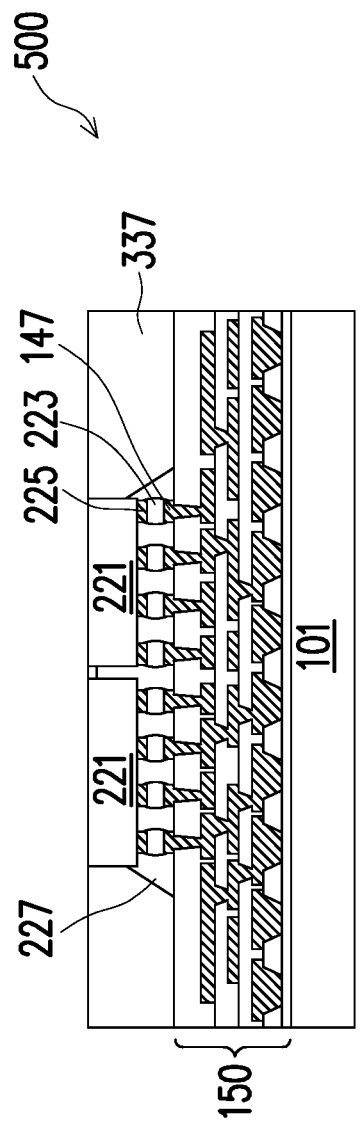

Next, in FIG. 30, one or more dies 221 are attached to the redistribution structure 150. In the illustrated example, the die connectors 225 of the dies 221 are coupled to the conductive pads 147 of the redistribution structure 150 by solder regions 223. Once the dies 221 are attached, the underfill material 227 is formed in the gap between the dies 221 and the redistribution structure 150. Next, a molding material 337 is formed around the dies 221 and the underfill material 227. A planarization process, such as CMP, may be performed to achieve a coplanar upper surface between the dies 221 and the molding material 337. The molding material 337 is different form the underfill material 227, in some embodiments.

Figure 31:
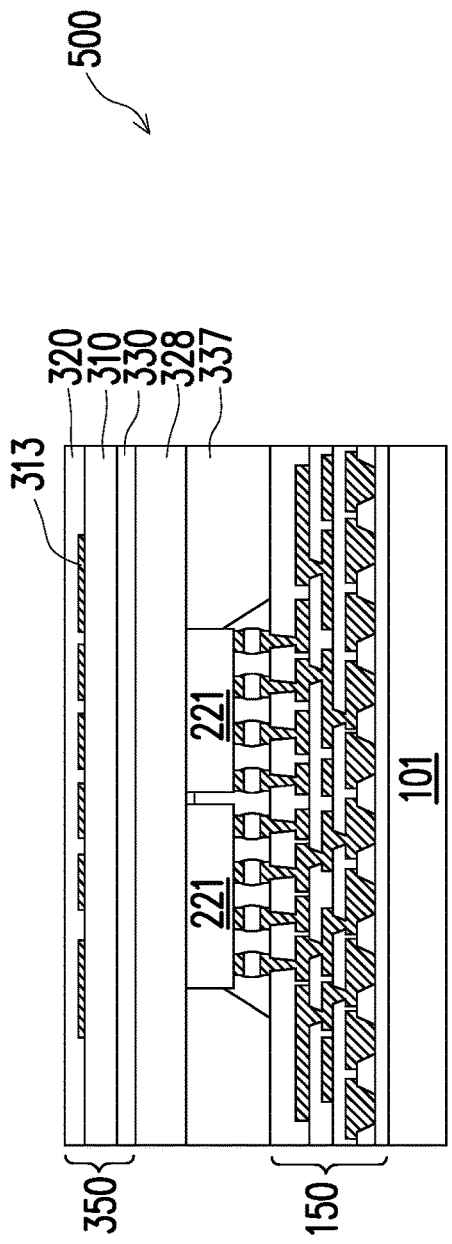

Referring next to FIG. 31, the pre-made substrate 350 is attached to the back sides of the dies 221 and the molding material 337 by an adhesive layer 328. The adhesive layer 328 may be a suitable dielectric layer, such as a glue layer, a DAF, or the like.

As illustrated in FIG. 31, there is no electrical connection between the dies 221 and the substrate 350, and there is no electrical connection between the redistribution structure 150 and the substrate 350. In the illustrated embodiment of FIGS. 29-32, the substrate 350 is used to increase the mechanical stability (e.g., rigidity) of the semiconductor device 500. In addition, the conductive features (e.g., 313) of the substrate 350 are used for the purpose of balancing the metal density (e.g., density of copper) on opposing sides (e.g., the front sides and the back sides) of the dies 221 to reduce warpage of the semiconductor device 500. For example, simulation and/or experiments may be performed to determine the amount and location of the conductive features of the substrate 350 to compensate for warpage induced by the CTE mismatch between, e.g., the dies 221 and the redistribution structure 150.

In some embodiments, the substrate 350 only has conductive features (e.g., 313) on one side of the core 310. There is no conductive vias 317 (see FIG. 4) or conductive features 315 (see FIG. 4) on the other side of the core 310. The conductive features (e.g., 313) of the substrate in FIG. 31 are therefore dummy metal patterns. In other words, the conductive features (e.g., 313) of FIG. 31 are metal patterns that are electrically isolated. Forming conductive features on one side of the core 310 simplifies the design, thus reducing the cost.

Figure 32:
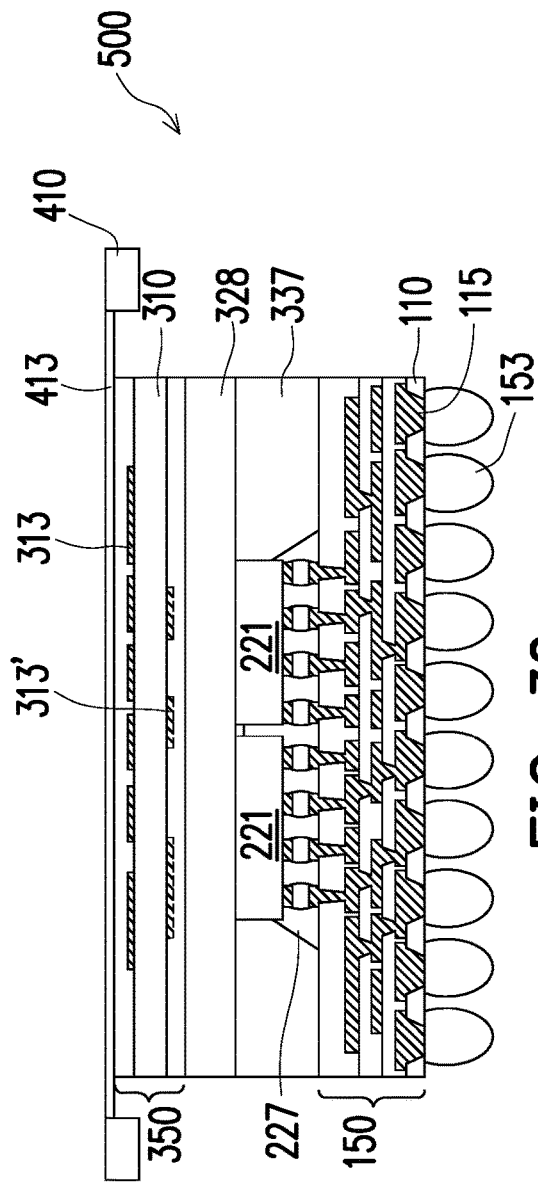

Next, in FIG. 32, the substrate 350 of the semiconductor device 500 is attached to the tape 413 supported by the frame 410, and the carrier 101 is de-bonded. The dielectric layer 110 of the redistribution structure 150 is then recessed to expose the conductive pads 115, and external connectors 153 are formed over the exposed conductive pads 115. Although not shown, dicing may be performed to separate the semiconductor device 500 from other neighboring semiconductor devices.

Variations to the embodiment of FIGS. 29-32 are possible. For example, the dummy conductive feature may be formed on the lower side of the core 310 (see conductive features 313' shown in phantom in FIG. 32) but not on the upper side of the core 310. In another embodiment, dummy conductive features may be formed on both the upper side (e.g., 313 in FIG. 32) and the low side (e.g., 313' in FIG. 32) of the core 310. These and other variations are fully intended to be included within the scope of the present disclosure.

Figure 33:
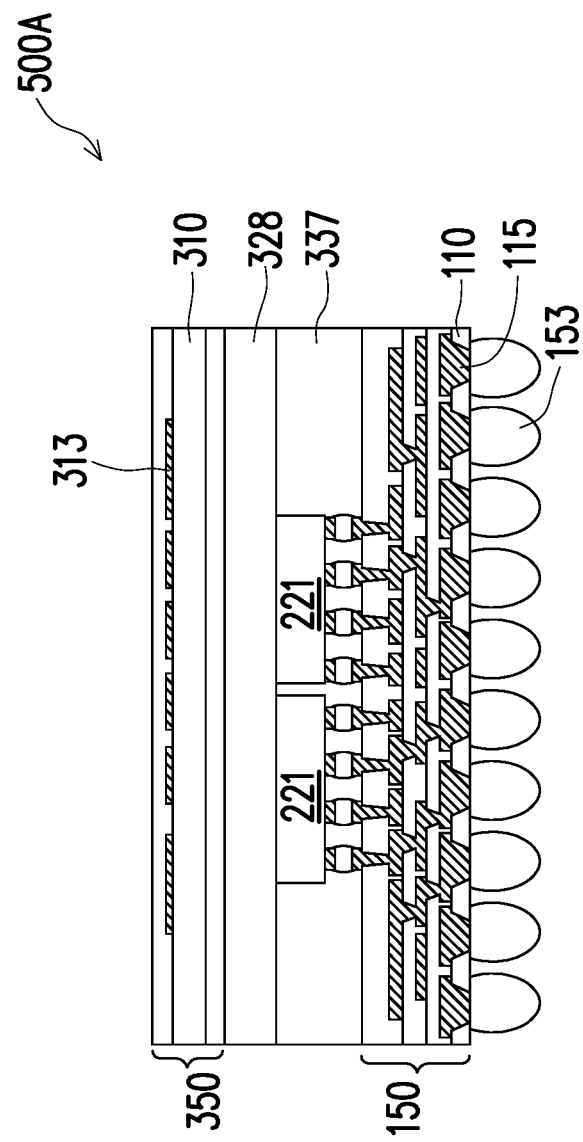
FIG. 33 illustrates a cross-sectional view of a semiconductor device, in accordance with an embodiment.

FIG. 33 illustrates another embodiment semiconductor device 500A, which is similar to the semiconductor device 500 in FIG. 32, but without the underfill material 227 between the dies 221 and the redistribution structure 150. The molding material 337 in FIG. 33 is an MUF material, in some embodiments. The molding material 337 is different from adhesive layer 328, in the illustrated embodiment. As discussed above, the dummy conductive features 313 may be formed on the upper side, the lower side, or both the upper side and the lower side of the core 310.

FIGS. 34-37 illustrate cross-sectional views of a semiconductor device 600 at various stages of fabrication, in accordance with an embodiment. Unless otherwise specified, similar numerals in FIGS. 34-37 refer to similar parts in FIGS. 1-6A and/or FIGS. 10-15. For example, components with the same numerals may be formed of the same or similar material, and may be formed using the same or similar formation method. For simplicity, details may not be repeated.

Figure 34:
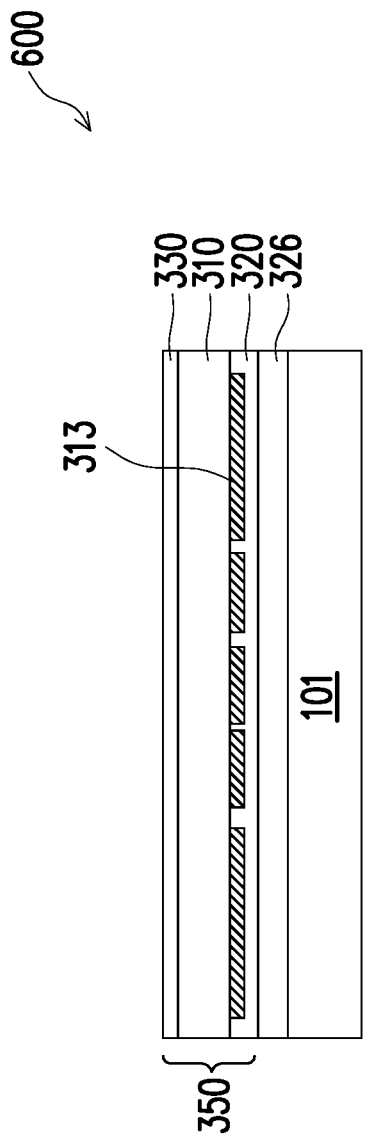
FIGS. 34-37 illustrate cross-sectional views of a semiconductor device at various stages of fabrication, in accordance with an embodiment.

Referring to FIG. 34, the substrate 350, which may be pre-made, is attached to the carrier 101 by an adhesive layer 326. The adhesive layer 326 may be the same as the adhesive layer 104 in FIG. 24, thus details are not repeated here.

The substrate 350 serves the same purpose as the substrate 350 in the semiconductor device 500 (see FIG. 32), and therefore, comprise dummy metal patterns, such as the conductive features 313. In the example of FIG. 33, the dummy metal patterns are formed only on one side of the core 310 that contacts the dielectric layer 320. Although not illustrated, the dummy metal patterns may be formed only on the other side of the core 310 contacting the dielectric layer 330, or on both sides of the core 310. These and other variations are fully intended to be included within the scope of the present disclosure.

Figure 35:
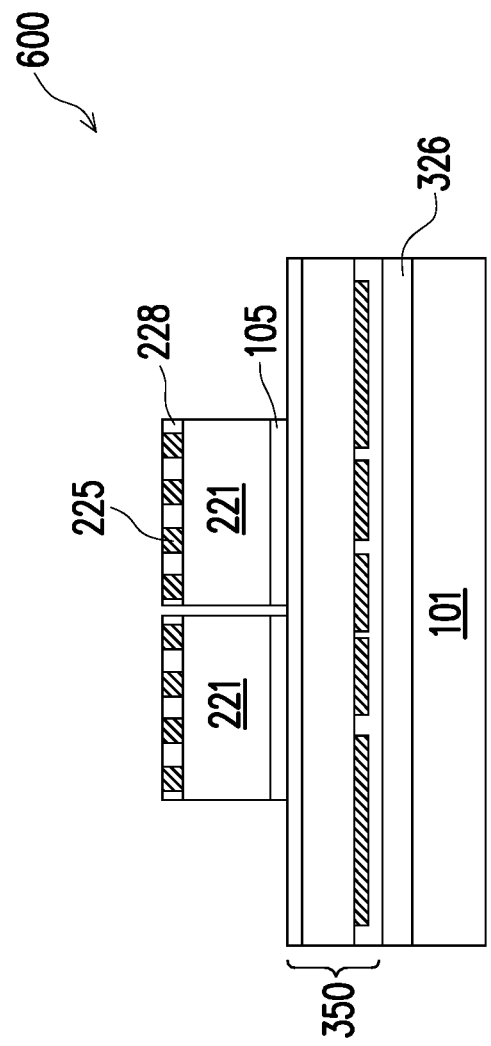

Next, in FIG. 35, one or more dies 221 are attached to the substrate 350 by the adhesive layer 105 (e.g., a DAF). The front sides of the dies 221 with the die connectors 225 face upward away from the substrate 350.

Figure 36:
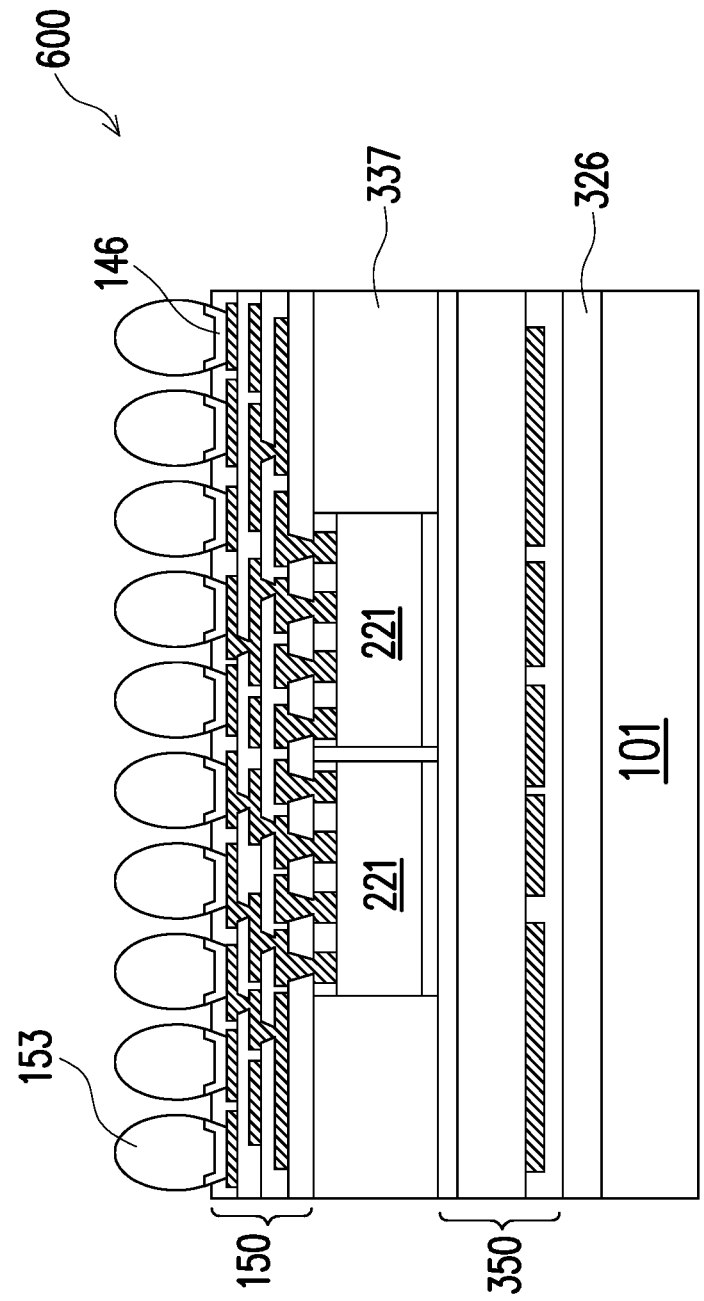

Next, in FIG. 36, the molding material 337 is formed over the substrate 350 and around the dies 221. A planarization process, such as CMP, may be performed to achieve a coplanar upper surface between the dies 221 and the molding material 337. Next, the redistribution structure 150 is formed over the dies 221 and the molding material 337. The redistribution structure 150 is electrically coupled to the dies 221. Next, external connectors 153 are formed over the UBM structures 146 that are electrically coupled to the redistribution structure 150.

Figure 37:
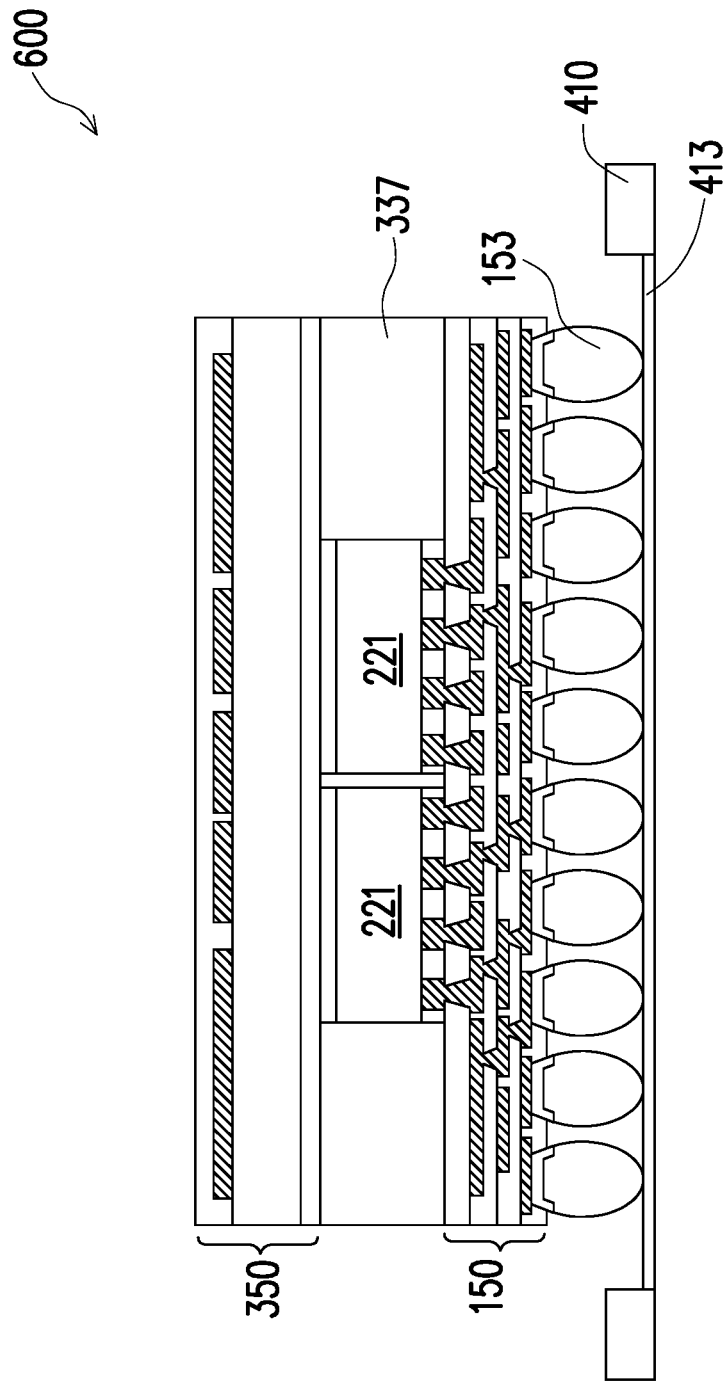

Referring next to FIG. 37, the external connectors 153 of the semiconductor device 600 are attached to the tape 413 supported by the frame 410, the carrier 101 is de-bonded, and the adhesive layer 326 is removed. A dicing process may be performed subsequently to separate the semiconductor device 600 from other neighboring devices formed.

Embodiments may achieve advantages. For example, compared with a semiconductor device where the substrate 350 is disposed between the dies 221 and the redistribution structure 150, the semiconductor devices (e.g., 100, 200, 300, 400, 500, and 600) in the present disclosure have shorter signal paths between the dies 221 and the external connectors 153. Having shorter signal paths reduces the signal delay (e.g., RC delay) and improves the performance of the semiconductor devices. In addition, by positioning the substrate 350 and the redistribution structure 150 on opposing sides of the dies 221, balancing of the metal density can be achieved, which reduces the warpage of the semiconductor device (e.g., 100, 200, 300, 400, 500, and 600), regardless of whether the conductive features of the substrate 350 are dummy metal patterns or not.

Figure 38:
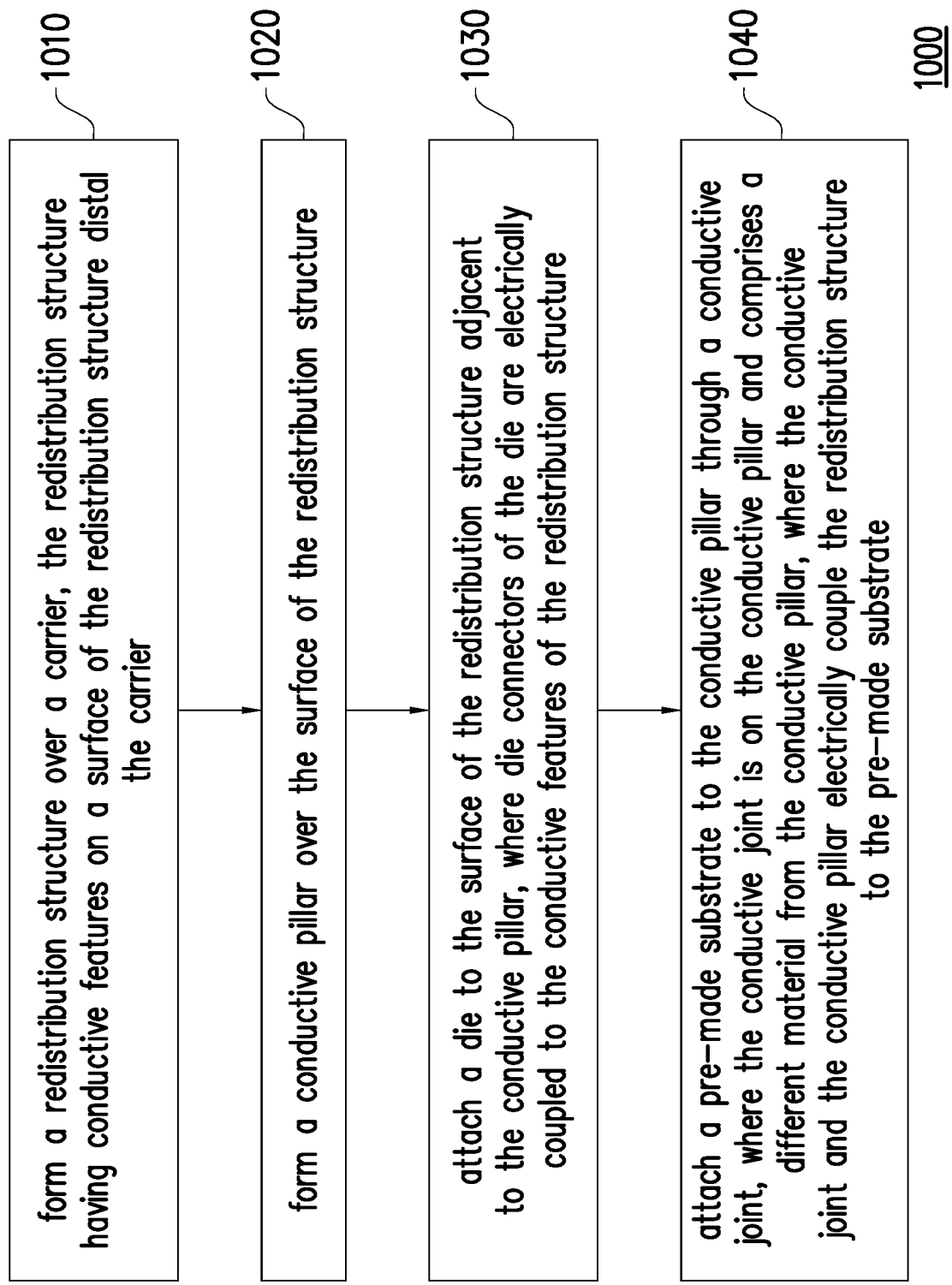
FIG. 38 illustrates a flow char of a method for forming a semiconductor device, in accordance with some embodiments.

FIG. 38 illustrates a flow chart of a method of fabricating a semiconductor device, in accordance with some embodiments. It should be understood that the embodiment method shown in FIG. 38 is merely an example of many possible embodiment methods. One of ordinary skill in the art would recognize many variations, alternatives, and modifications. For example, various steps as illustrated in FIG. 38 may be added, removed, replaced, rearranged and repeated.

Referring to FIG. 38, at step 1010, a redistribution structure is formed over a carrier, the redistribution structure having conductive features on a surface of the redistribution structure distal the carrier. At step 1020, a conductive pillar is formed over the surface of the redistribution structure. At step 1030, a die is attached to the surface of the redistribution structure adjacent to the conductive pillar, where die connectors of the die are electrically coupled to the conductive features of the redistribution structure. At step 1040, a pre-made substrate is attached to the conductive pillar through a conductive joint, where the conductive joint is on the conductive pillar and comprises a different material from the conductive pillar, where the conductive joint and the conductive pillar electrically couple the redistribution structure to the pre-made substrate.

In an embodiment, a method includes forming a redistribution structure over a carrier, the redistribution structure having conductive features on a surface of the redistribution structure distal the carrier; forming a conductive pillar over the surface of the redistribution structure; attaching a die to the surface of the redistribution structure adjacent to the conductive pillar, where die connectors of the die are electrically coupled to the conductive features of the redistribution structure; and attaching a pre-made substrate to the conductive pillar through a conductive joint, where the conductive joint is on the conductive pillar and comprises a different material from the conductive pillar, where the conductive joint and the conductive pillar electrically couple the redistribution structure to the pre-made substrate. In an embodiment, the conductive joint is a solder region. In an embodiment, the method further includes after attaching the pre-made substrate, attaching a semiconductor device to a surface of the pre-made substrate distal the redistribution structure. In an embodiment, a surface of the conductive pillar distal the redistribution structure is closer to the redistribution structure than a surface of the die distal the redistribution structure. In an embodiment, the method further includes after attaching the pre-made substrate, filling a space between the pre-made substrate and redistribution structure using a first molding material. In an embodiment, the method further includes after attaching the die and before attaching the pre-made substrate, forming a second molding material different from the first molding material in a gap between the die and the redistribution structure. In an embodiment, the method further includes after attaching the die and before attaching the pre-made substrate, forming a first molding material around the die and around the conductive pillar; and after attaching the pre-made substrate, filling a space between the first molding material and the pre-made substrate using a second molding material different from the first molding material, where the conductive joint is surrounded by the second molding material. In an embodiment, the method further includes removing the carrier from the redistribution structure; recessing a dielectric layer of the redistribution structure, where the recessing of the dielectric layer exposes conductive features of the redistribution layer; and forming conductive bumps over the exposed conductive features.

In an embodiment, a method includes forming a redistribution structure over a carrier, the redistribution structure having conductive pads on a first surface of the redistribution structure distal the carrier; bonding die connectors of a die to the conductive pads; forming a molding material over the carrier and around the die; attaching a pre-made substrate to the molding material and the die through an adhesive layer, the pre-made substrate having dummy metal features that are electrically isolated; after attaching the pre-made substrate, recessing a dielectric layer of the redistribution structure to expose conductive features of the redistribution structure; and forming conductive bumps on the exposed conductive features. In an embodiment, the die connectors of the die are bonded to the conductive pads by solder regions. In an embodiment, the pre-made substrate comprises a dielectric core, and the dummy metal features are disposed on at least one side of the dielectric core. In an embodiment, the method of further includes after attaching the pre-made substrate and before recessing the dielectric layer: attaching the pre-made substrate to a tape; and de-bonding the carrier from the redistribution structure.

In an embodiment, a semiconductor device includes a first die embedded in a first molding material, the first die having die connectors at a first side of the first die; a first conductive pillar embedded in the first molding material and laterally spaced apart from the first die; a redistribution structure at the first side of the first die, the die connectors being electrically coupled to conductive features of the redistribution structure by solder joints, the conductive features being on a surface of the redistribution structure facing the first die; a substrate at a second side of the first die opposing the first side; and a first solder region interposed between the first conductive pillar and the substrate, where the first solder region and the first conductive pillar electrically couple the redistribution structure to the substrate. In an embodiment, a surface of the first conductive pillar distal the redistribution structure is closer to the redistribution structure than the second side of the first die. In an embodiment, the first molding material extends continuously from the redistribution structure to the substrate, and where the first solder region is embedded in the first molding material. In an embodiment, the semiconductor device further includes an underfill material between the first die and the redistribution structure, where the underfill material is different from the first molding material. In an embodiment, the semiconductor device further includes a second molding material between the first molding material and the substrate, where the second molding material is different from the first molding material. In an embodiment, an upper surface of the first conductive pillar is level with the second side of the first die and an upper surface of the first molding material. In an embodiment, the substrate includes a dielectric core, conductive vias extending through the dielectric core, and conductive lines on at least one side of the dielectric core. In an embodiment, the semiconductor device further includes solder bumps on a side of the substrate facing away from the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a redistribution structure over a carrier;
    forming a conductive pillar on a first surface of the redistribution structure facing away from the carrier, wherein the conductive pillar is formed on a first conductive feature of the redistribution structure;
    attaching a first die to the first surface of the redistribution structure adjacent to the conductive pillar;
    bonding a first substrate to the conductive pillar using a first solder region, wherein the first substrate comprises a dielectric core, a first conductive line contacting and extending along a first surface of the dielectric core distal from the first die, a second conductive line contacting and extending along a second surface of the dielectric core facing the first die, a first dielectric layer along the first surface of the dielectric core and covering the first conductive line, and a second dielectric layer along the second surface of the dielectric core and covering the second conductive line, wherein the conductive pillar is formed of a first conductive material having a different composition than the first solder region, wherein bonding the first substrate comprises depositing a solder paste over the conductive pillar and performing a reflow process to melt the solder paste and form the first solder region, wherein the first solder region has curved sidewalls, wherein the first solder region extends from an upper surface of the conductive pillar distal from the carrier to the first substrate, through the second dielectric layer, and contacts the second conductive line; and
    after bonding the first substrate, forming a first molding material between the redistribution structure and the first substrate, wherein the first molding material surrounds the first die and the conductive pillar, wherein the first molding material contacts and extends along the curved sidewalls of the first solder region.

2. The method of claim 1, wherein the first substrate is pre-formed before being bonded to the conductive pillar.

3. The method of claim 1, wherein attaching the first die comprises bonding the first die to first conductive pads at the first surface of the redistribution structure using second solder regions.

4. The method of claim 3, further comprising, after attaching the first die and before bonding the first substrate, forming an underfill material between the first die and the redistribution structure, wherein the underfill material surrounds the second solder regions, wherein the first molding material surrounds the underfill material.

5. The method of claim 4, wherein the first molding material is formed to extend continuously from the first surface of the redistribution structure to the first substrate.

6. The method of claim 1, wherein the upper surface of the conductive pillar is closer to the redistribution structure than an upper surface of the first die distal from the redistribution structure.

7. A method comprising:
forming a conductive pillar over a first surface of a redistribution structure, the conductive pillar being formed on a first conductive pad at the first surface of the redistribution structure;
attaching a first die to the first surface of the redistribution structure adjacent to the conductive pillar, wherein die connectors of the first die are electrically coupled to first conductive features of the redistribution structure;
attaching a pre-made substrate to the conductive pillar through a conductive joint, wherein the pre-made substrate comprises a dielectric core, a first conductive line on a first side of the dielectric core facing the first die, a first dielectric layer along the first side of the dielectric core over the first conductive line, and a conductive connector at a second side of the dielectric core distal from the first die, wherein the conductive joint is formed on the conductive pillar and comprises a different material from the conductive pillar, wherein the conductive joint extends continuously from the conductive pillar into the first dielectric layer of the pre-made substrate to contact the first conductive line; and
after attaching the pre-made substrate, bonding a semiconductor package to the conductive connector of the pre-made substrate using solder, wherein the semiconductor package comprises:
a second substrate; and
a second die attached to a first side of the second substrate distal from the pre-made substrate.

8. The method of claim 7, further comprising, after attaching the pre-made substrate and before bonding the semiconductor package, performing a reflow process to bond the pre-made substrate to the conductive pillar through the conductive joint.

9. The method of claim 8, wherein the conductive pillar comprises a same conductive material as the first conductive features of the redistribution structure.

10. The method of claim 9, wherein the conductive joint is a solder region.

11. The method of claim 8, further comprising, after performing the reflow process and before bonding the semiconductor package, forming a first molding material between the redistribution structure and the pre-made substrate, wherein the first molding material surrounds the first die, the conductive pillar, and the conductive joint.

12. A method comprising:
forming a redistribution structure over a carrier;
forming a conductive pillar on a first conductive feature of the redistribution structure at an upper surface of the redistribution structure;
bonding a first die to the upper surface of the redistribution structure through first solder regions;
after bonding the first die, bonding a pre-formed substrate to the conductive pillar through a second solder region, wherein the conductive pillar and the second solder region comprise different materials, wherein the second solder region extends continuously from the conductive pillar to a second conductive feature of the pre-formed substrate, wherein the second conductive feature is recessed from a lower surface of a first dielectric layer of the pre-formed substrate facing the first die, and the second solder region extends into the first dielectric layer of the pre-formed substrate;

forming a first molding material between the redistribution structure and the pre-formed substrate, the first molding material surrounding and contacting the second solder region; and
after forming the first molding material, bonding a semiconductor package to a first side of the pre-formed substrate distal from the first die through a third solder region, wherein the semiconductor package comprises:
a second substrate; and
a second die attached to a first side of the second substrate distal from the pre-formed substrate.

13. The method of claim 12, wherein the first molding material is formed after bonding the pre-formed substrate, wherein the first molding material further surrounds and contacts the conductive pillar and the first die, wherein the first molding material extends continuously without an interface from the redistribution structure to the pre-formed substrate.

14. The method of claim 2, wherein the first substrate further comprises a first conductive connector at the first surface of the dielectric core, wherein the first conductive connector extends through the first dielectric layer and contacts the first conductive line, wherein the method further comprises, after bonding the first substrate and forming the first molding material:
attaching the first conductive connector to a tape;
after attaching the first conductive connector to the tape, removing the carrier from the redistribution structure; and
after removing the carrier, forming a second conductive connector on a second surface of the redistribution structure opposing the first surface of the redistribution structure.

15. The method of claim 14, further comprising, after forming the second conductive connector, bonding a semiconductor package to the first conductive connector using a second solder region, wherein the semiconductor package comprises:
a second substrate;
a second die attached to a first side of the second substrate distal from the first substrate, wherein a second side of the second substrate facing the first substrate is spaced apart from the first substrate, wherein a second conductive pad at the second side of the second substrate is bonded to the first conductive connector by the second solder region; and
a second molding material on the first side of the second substrate around the second die, wherein the second molding material and the second substrate have a same width such that sidewalls of the second molding material are vertically aligned with respective sidewalls of the second substrate.

16. The method of claim 1, wherein attaching the first die comprises bonding a die connector of the first die to a conductive pad of the redistribution structure by solder.

17. The method of claim 16, wherein the redistribution structure is formed to include an upper dielectric layer closest to the first die, wherein an upper portion of the conductive pad extends above a first side of the upper dielectric layer facing the first die, and a lower portion of the conductive pad extends into the upper dielectric layer and physically contacts an uppermost metal layer of the redistribution structure closest to the first die, wherein sidewalls of the lower portion of the conductive pad physically contact the upper dielectric layer of the redistribution structure, wherein the solder is disposed on the upper portion of the conductive pad.

18. The method of claim 17, wherein the conductive pillar is formed to have an upper portion over the first side of the upper dielectric layer of the redistribution structure, and is formed to have a lower portion extending into the upper dielectric layer and physically contacting the uppermost metal layer of the redistribution structure, wherein the upper portion and the lower portion of the conductive pillar have a same material composition.

19. The method of claim 7, wherein a second opposing side of the second substrate is spaced apart from the pre-made substrate, wherein a second conductive pad at the second opposing side of the second substrate is bonded to the conductive connector by solder, wherein the semiconductor package further comprises a first molding material on the first side of the second substrate around the second die, wherein the first molding material and the second substrate have a same width such that sidewalls of the first molding material are aligned with respective sidewalls of the second substrate.

20. The method of claim 12, wherein a second opposing side of the second substrate is spaced apart from the pre-formed substrate, wherein a conductive pad at the second opposing side of the second substrate is bonded to a third conductive feature of the pre-formed substrate by the third solder region, wherein the semiconductor package further comprises a second molding material on the first side of the second substrate around the second die, wherein the second molding material and the second substrate have a same width such that sidewalls of the second molding material are aligned with respective sidewalls of the second substrate.

* * * * *